(12) United States Patent
Tanaka et al.

(10) Patent No.: US 8,338,278 B2
(45) Date of Patent: Dec. 25, 2012

(54) METHOD OF MANUFACTURING SEMICONDUCTOR DEVICE WITH CRYSTALLIZED SEMICONDUCTOR FILM

(75) Inventors: Koichiro Tanaka, Kanagawa (JP); Takatsugu Omata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 636 days.

(21) Appl. No.: 11/945,891

(22) Filed: Nov. 27, 2007

(65) Prior Publication Data

US 2008/0131663 A1    Jun. 5, 2008

(30) Foreign Application Priority Data

Dec. 4, 2006   (JP) .................................. 2006-327584

(51) Int. Cl.
*H01L 21/20*    (2006.01)

(52) U.S. Cl. .......... 438/487; 438/486; 438/168; 257/75; 257/E21.133

(58) Field of Classification Search .................. 438/166, 438/486

See application file for complete search history.

(56) References Cited

U.S. PATENT DOCUMENTS

| | | | |
|---|---|---|---|
| 5,966,596 A | 10/1999 | Ohtani et al. | |
| 6,458,635 B2 * | 10/2002 | Yamazaki et al. | 438/149 |
| 6,458,637 B1 | 10/2002 | Yamazaki et al. | |
| 6,489,222 B2 | 12/2002 | Yoshimoto | |
| 6,825,896 B2 | 11/2004 | Goto et al. | |
| 6,881,615 B2 | 4/2005 | Yamazaki et al. | |
| 6,972,246 B2 | 12/2005 | Nakano et al. | |
| 7,022,590 B2 | 4/2006 | Yamazaki et al. | |
| 7,094,452 B2 | 8/2006 | Yamashita et al. | |
| 7,189,665 B2 | 3/2007 | Nakano et al. | |
| 7,662,703 B2 | 2/2010 | Moriwaka et al. | |
| 7,935,584 B2 | 5/2011 | Moriwaka et al. | |
| 2002/0058399 A1 * | 5/2002 | Sato et al. | 438/486 |
| 2003/0102286 A1 | 6/2003 | Takahara et al. | |
| 2003/0180992 A1 * | 9/2003 | Shimomura et al. | 438/166 |
| 2004/0227446 A1 | 11/2004 | Fujimoto et al. | |
| 2005/0074579 A1 | 4/2005 | Suzuki et al. | |
| 2005/0115930 A1 | 6/2005 | Tanaka et al. | |
| 2005/0190321 A1 | 9/2005 | Ohsawa | |
| 2007/0087488 A1 | 4/2007 | Moriwaka | |
| 2007/0222038 A1 | 9/2007 | Moriwaka | |

FOREIGN PATENT DOCUMENTS

| | | |
|---|---|---|
| JP | 2003-168646 | 6/2003 |
| JP | 2004-343007 | 12/2004 |
| JP | 2005-191546 | 7/2005 |
| JP | 2006-171229 | 6/2006 |
| JP | 2007-288127 | 11/2007 |

* cited by examiner

*Primary Examiner* — Ajay K Arora
(74) *Attorney, Agent, or Firm* — Nixon Peabody LLP; Jeffrey L. Costellia

(57) ABSTRACT

To form a semiconductor film with a thickness of 50 nm or less, which includes a large grain crystal by totally melting the semiconductor film with a laser beam. A projection having a triangular cross section is formed on the surface of a semiconductor film. The shape of the projection is a conical shape or a triangular prismatic shape. A laser beam which has entered a projection of the semiconductor film travels toward a substrate while being greatly refracted and totally reflected at the interface between the projection and the air. Further, since the laser beam enters the semiconductor film from a projection, the laser beam which is incident on the interface between an insulating film and a semiconductor is very likely totally reflected. Thus, when a laser beam enters a semiconductor film from a projection, the time during which the laser beam propagates through the semiconductor film is longer, which can increase the absorptance of the semiconductor film.

13 Claims, 24 Drawing Sheets

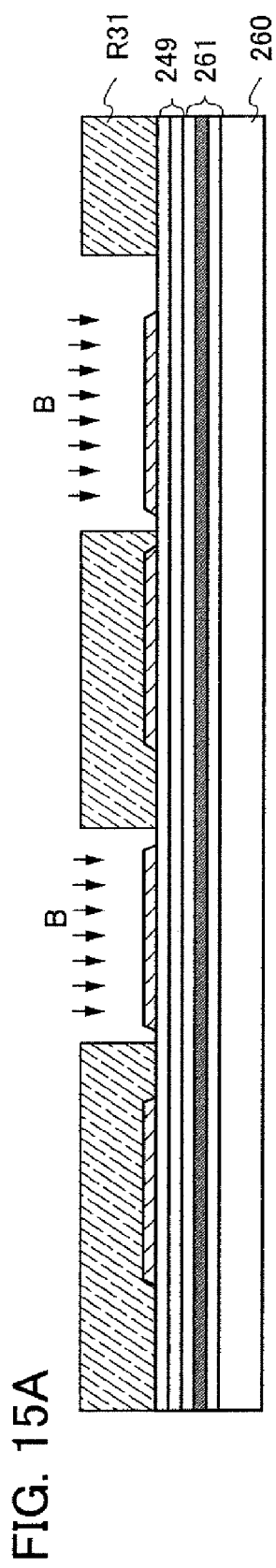
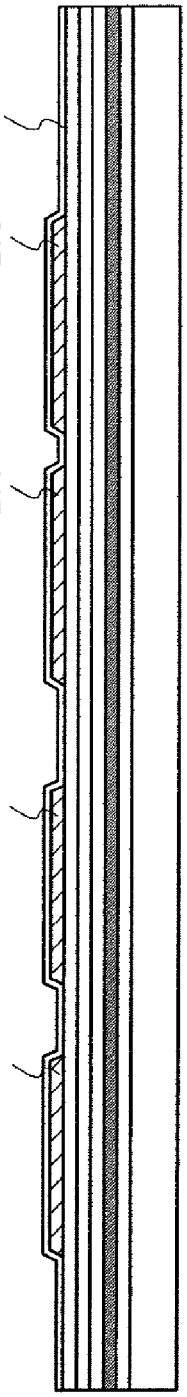
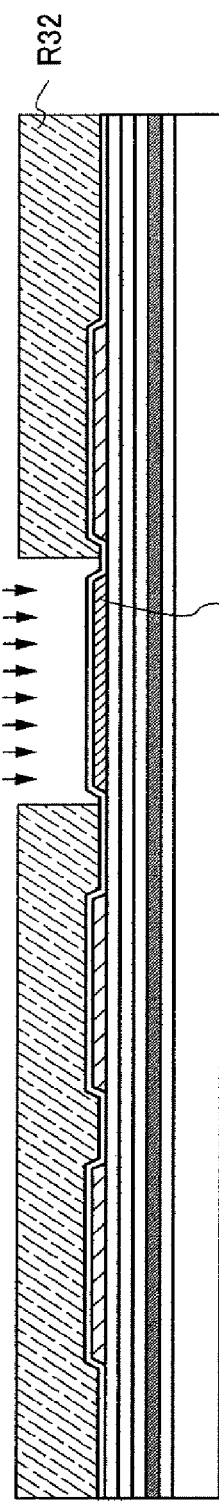
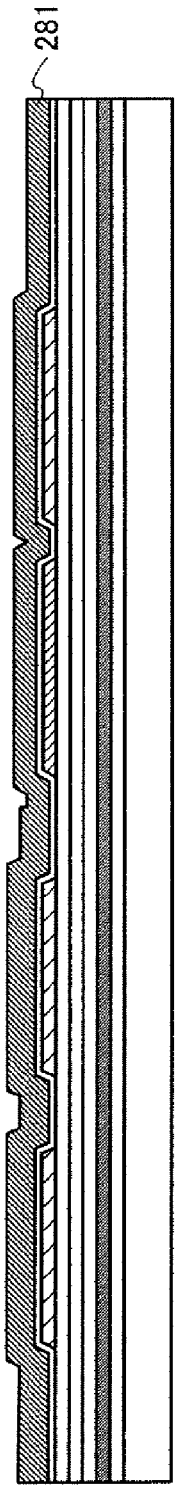

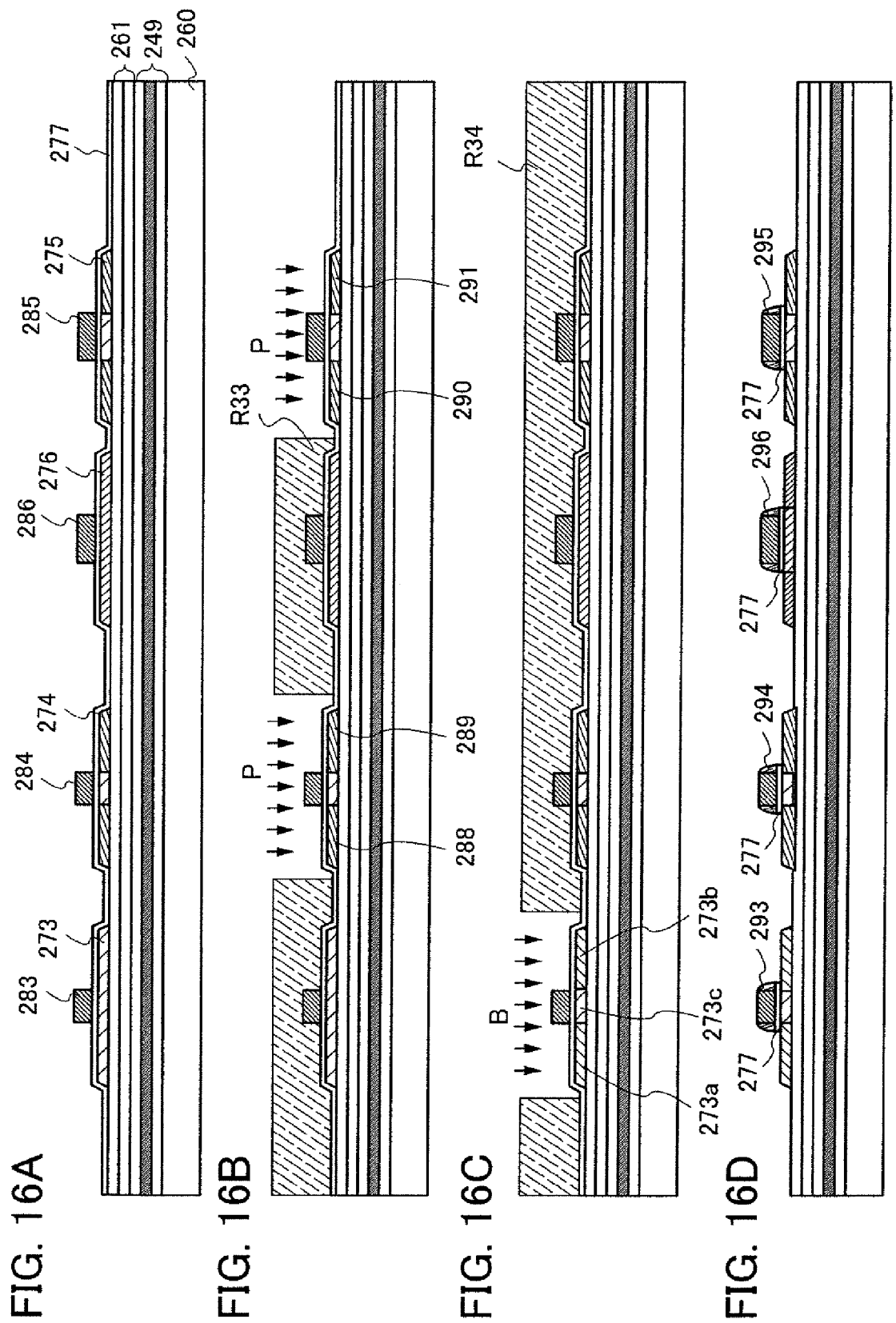

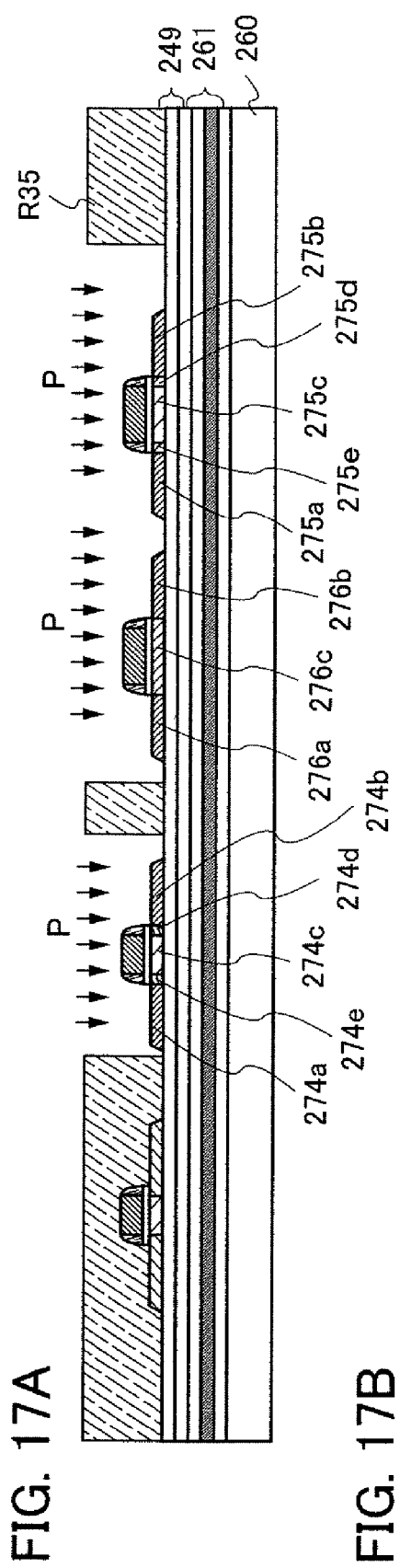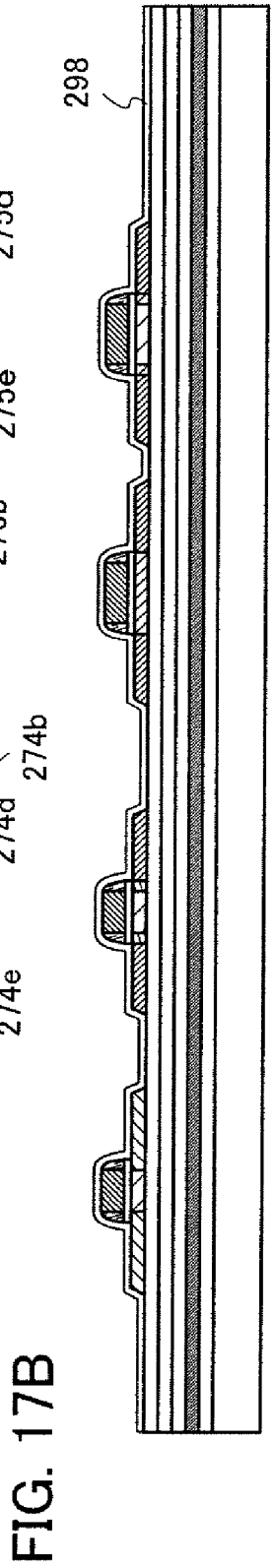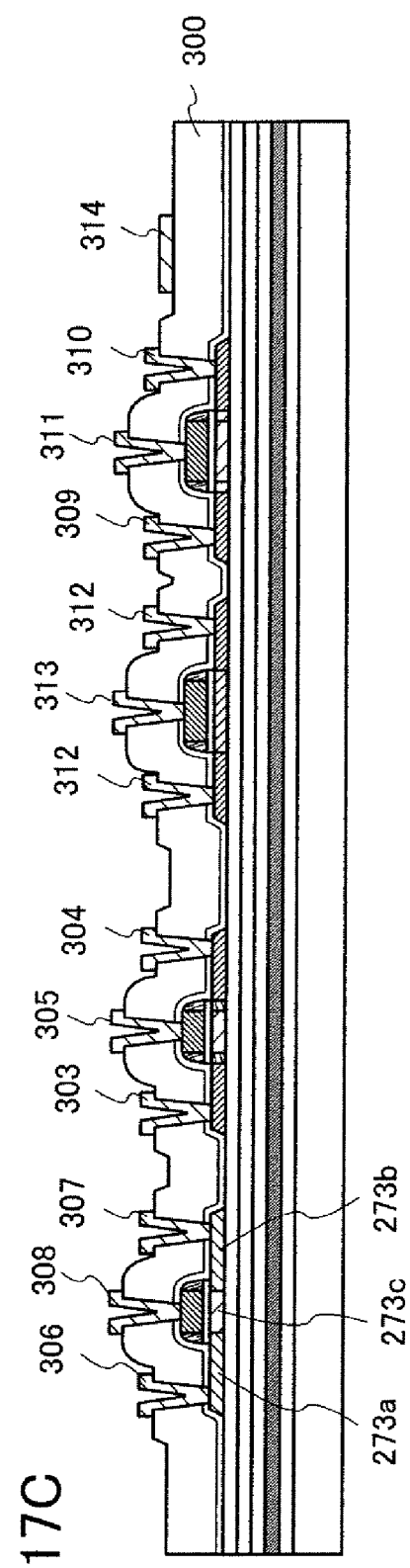

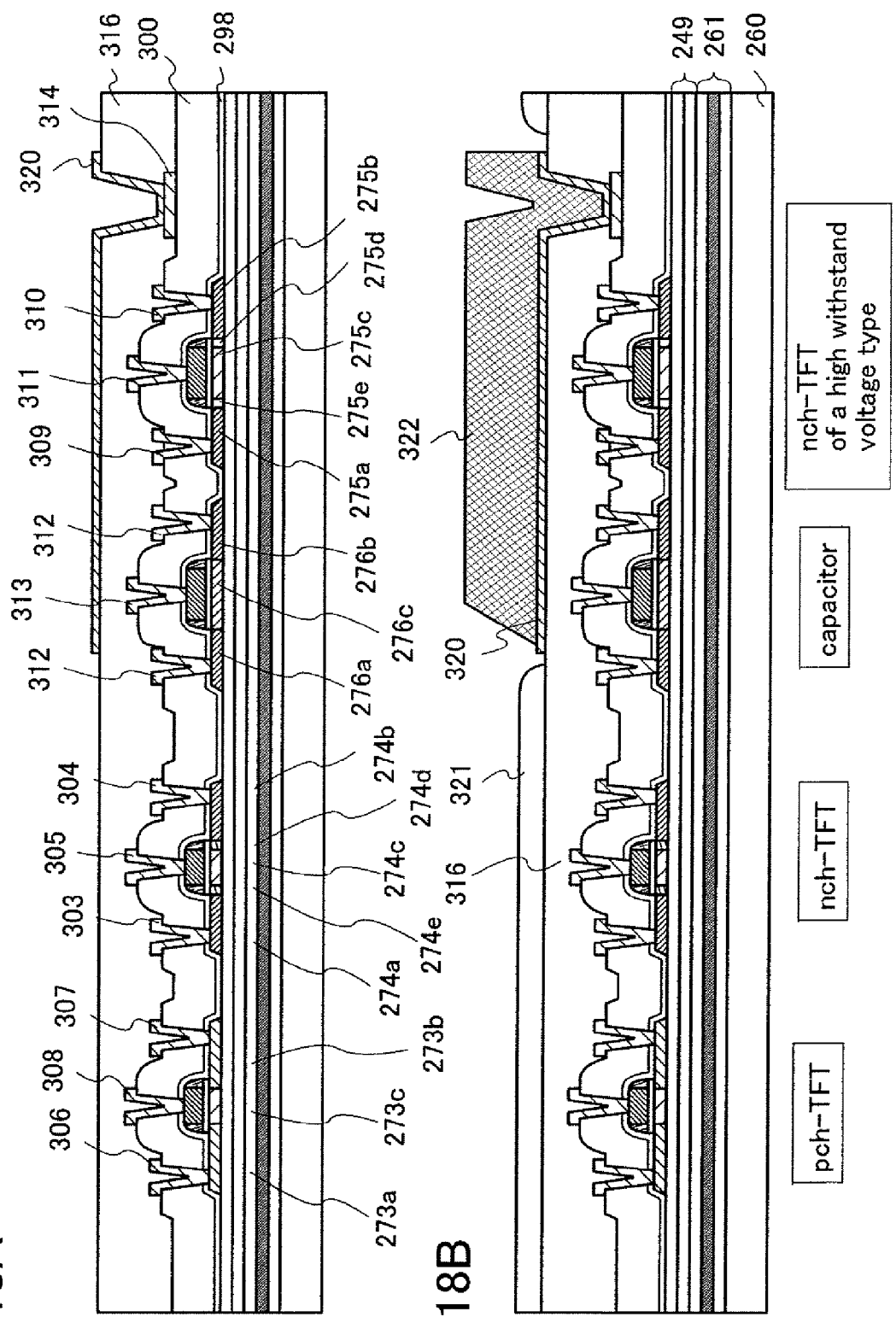

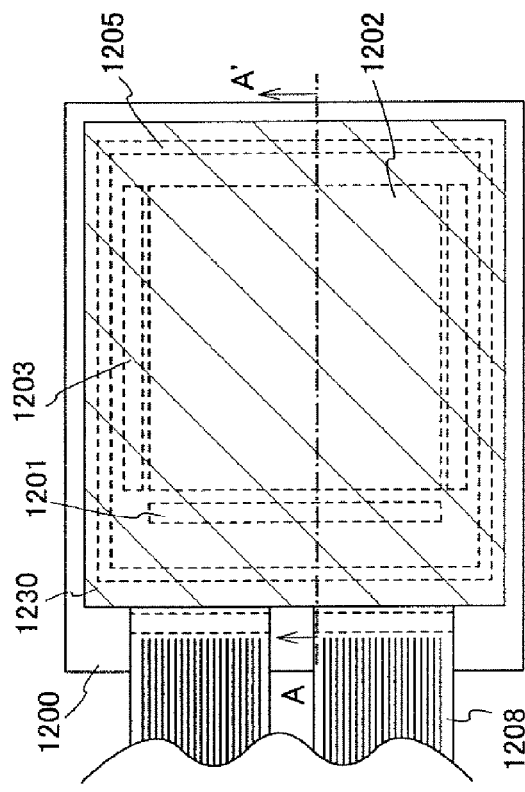
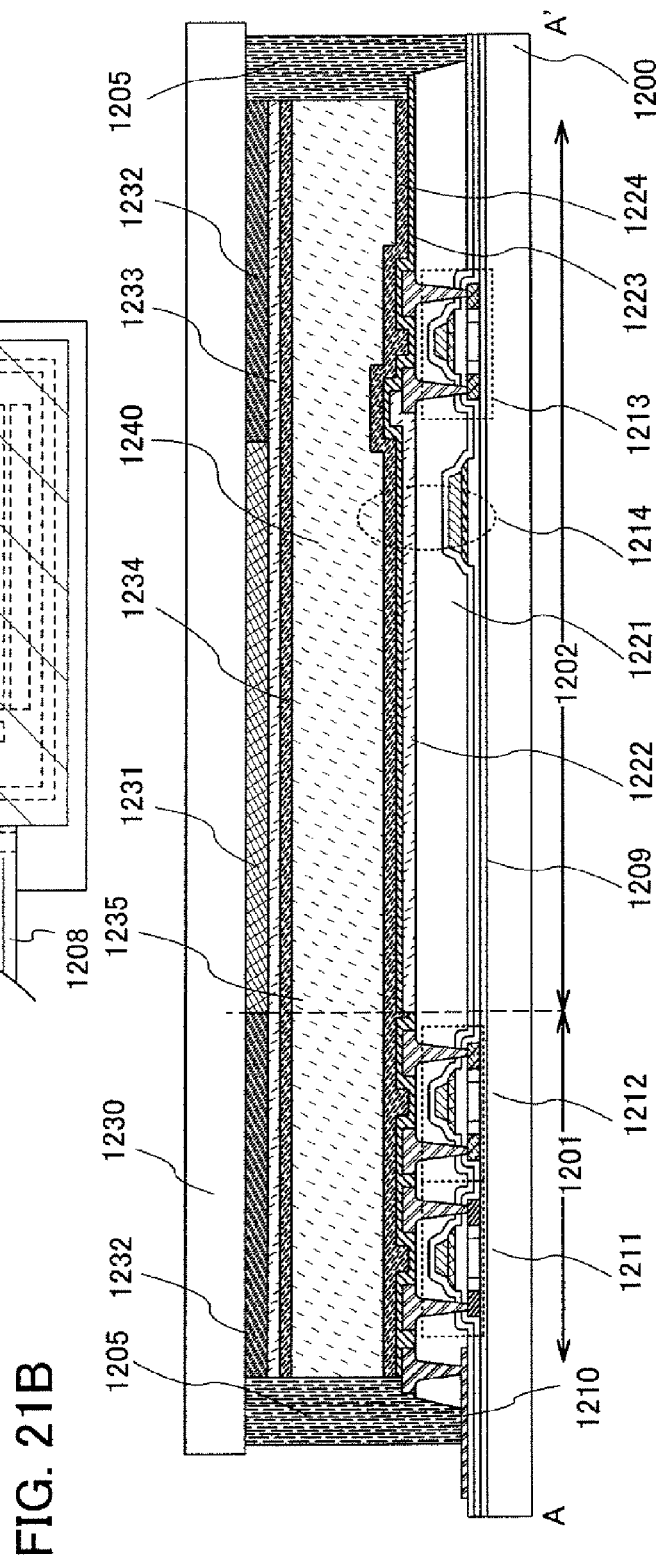
FIG. 21A
FIG. 21B

FIG. 23A
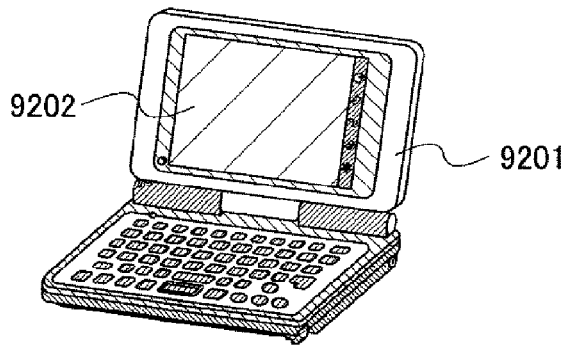
FIG. 23B
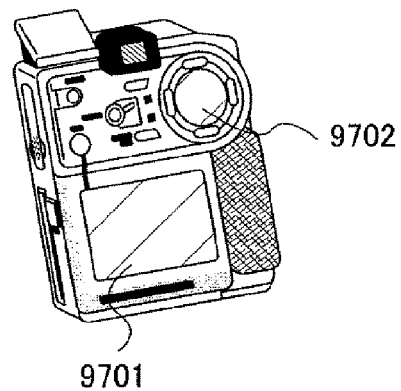
FIG. 23C
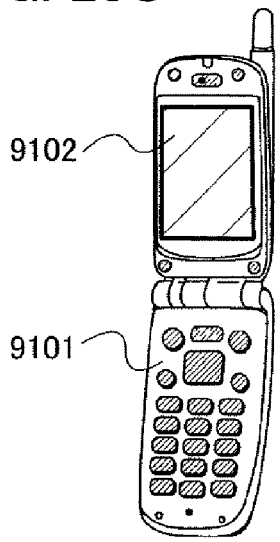
FIG. 23D
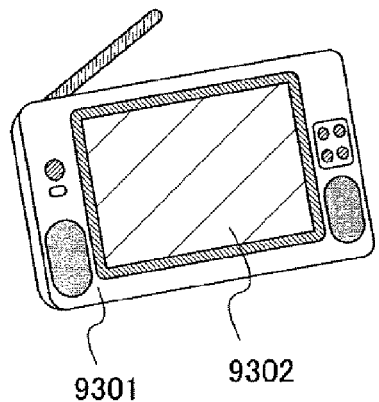
FIG. 23E
FIG. 23F
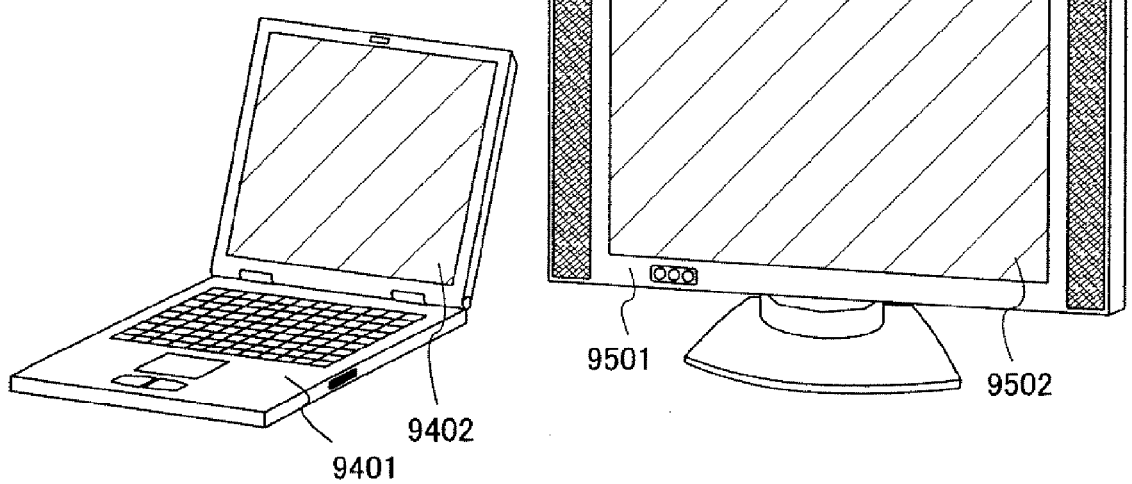

METHOD OF MANUFACTURING SEMICONDUCTOR DEVICE WITH CRYSTALLIZED SEMICONDUCTOR FILM

BACKGROUND OF THE INVENTION

1. Field of the Invention

The present invention relates to a method of manufacturing a semiconductor device using a semiconductor film having a crystalline structure. In particular, the invention relates to a crystallization technology for forming a semiconductor film having a crystalline structure by irradiating a semiconductor film with a laser beam.

2. Description of the Related Art

In recent years, a laser crystallization technique for forming a semiconductor film having a crystalline structure (hereinafter, a crystalline semiconductor film) by irradiating an amorphous semiconductor film which is formed over a glass substrate with a laser beam has been researched well. A crystalline semiconductor film is used because of high mobility as compared with an amorphous semiconductor film. Crystalline semiconductor films over a glass substrate are used, for example, for an active matrix liquid crystal display device or an organic EL display device, in each of which thin film transistors for a pixel portion or for a pixel portion and a driver circuit are formed over one glass substrate.

As a crystallization method, a thermal annealing method using an annealing furnace, a rapid thermal annealing method (RTA method), a laser annealing method (a crystallization method by laser irradiation), or the like can be given. In a case of using a solid phase growth method like a thermal annealing method, high-temperature treatment is performed at 600° C. or more is performed; therefore, an expensive quartz substrate that can withstand the high temperature is needed, which increases a manufacturing cost. On the other hand, when a laser beam is used for crystallization, crystallization can be performed by making only a semiconductor film absorb heat without significantly increasing the temperature of a substrate. Therefore, a material having a low melting point such as glass or plastic can be used for a substrate.

As one of laser annealing methods, there is a crystallization method using an excimer laser, which is a pulsed laser. The wavelength of an excimer laser is in an ultraviolet region, and absorptance with respect to silicon is high. Therefore, when an excimer laser is used, most of the laser beam can be absorbed into silicon. For example, in the case performing excimer laser annealing, a rectangular laser spot of approximately 10 mm×30 mm which is formed with light emitted from an excimer laser is shaped into a linear beam spot of several hundreds of μm in width and greater than or equal to 300 mm in length by using an optical system. The linearized beam spot is scanned with respect to the silicon film over the substrate to crystallize the silicon film. In this specification, a rectangular or elliptical shape having a high aspect ratio (of 10 or more) is referred to as a linear shape.

As another annealing method, there are crystallization methods using a continuous-wave laser (hereinafter, referred to as a CW laser) and a pulsed laser having a repetition rate as high as 10 MHz or more. Also in such laser annealing using a laser, a beam emitted from a laser is shaped into a linear beam spot, and the linear beam spot is scanned to irradiate the silicon film, thereby crystallizing the silicon film. When a CW laser or a pulsed laser having a high repetition rate is used, a silicon film can be completely melted and crystallized; thus, a crystalline silicon film having a crystal with a significantly large grain size (hereinafter referred to as, a large grain crystal) can be formed as compared with the case of excimer laser annealing (for example, see Reference 1: Japanese Published Patent Application No. 2005-191546). That is because a solid-liquid interface can be scanned with the linear beam spot in the laser annealing using a CW laser or the like, thereby making a crystal grow laterally while crystallization is performed by incidental core nucleation caused between the silicon film and its base interface in excimer laser annealing.

When this large grain crystal is used for a channel formation region of a thin film transistor, few crystal grain boundaries are included in the channel direction; therefore, an energy barrier against carriers such as electrons or holes gets lower. Consequently, it is possible to manufacture a thin film transistor having mobility of approximately 100 cm$^2$/Vs.

SUMMARY OF THE INVENTION

There is a demand for miniaturizing thin film transistors as well as MOS transistors formed over a silicon wafer. In response, the thickness of a silicon film to be a channel formation region of a thin film transistor is required to be 50 nm or less. However, it is very difficult to form a large grain crystal in a silicon film having a thickness of 50 nm or less by using a laser annealing method.

The crystal structure of a crystalline silicon film formed by the irradiation with the laser beam depends on the energy of a laser beam. When the energy of the laser beam is increased, the crystal structure changes from a microcrystalline structure to a large grain crystal structure through a small grain crystal structure. In order to form a large grain crystal, it is known that an energy capable of completely melting an amorphous silicon film is required. Naturally, when the energy of a laser beam is excessively high, the silicon film would break (split) or ablate.

FIG. 24 illustrates dependency of the reflectance, transmittance, and absorptance on the film thickness of an amorphous silicon film with respect to light having a wavelength of 532 nm. The horizontal axis of the graph in FIG. 24 represents the thickness of an amorphous silicon film, and the vertical axis represents the ratio of reflectance, transmittance, and absorptance. As apparent from FIG. 24, when the thickness of the amorphous silicon film is 50 nm or less, as the film thickness decreases, the absorptance decreases, and most of the light is reflected at or transmitted through the amorphous silicon film. As compared with the case where the film thickness is 50 nm, in a case where the film thickness is 20 nm, the absorptance is approximately ⅓ and the transmittance is twice or more.

Therefore, as in the case of crystallizing an amorphous silicon film having a thickness of 50 nm, the energy of a laser beam is required to be very high to form a large grain crystal from an amorphous silicon film having a thickness of 20 nm. Accordingly, a laser is made to oscillate with high output power; thus, the life of a laser medium would be shorter. Further, high energy is supplied to the amorphous silicon film; thus, it becomes very difficult to optimize the energy of the laser beam, which leads to susceptibility of the film to ablate.

In view of the above problems, it is an object of the present invention to provide a method of manufacturing a semiconductor device in which a large grain crystal is formed in an ultrathin semiconductor film having a thickness of 50 nm or less by irradiation with a laser beam.

Silicon, a typical example of semiconductors, has a significantly high refractive index of approximately 4. An object of the present invention is that the energy of a laser beam is efficiently absorbed as thermal energy into such a semiconductor film having a high refractive index.

One aspect of the present invention is to increase the optical length of a laser beam in a semiconductor film. In response, a plurality of projections with a triangular cross-sectional shape is formed on a surface of the semiconductor film. Alternatively, a plurality of projections with a triangular cross-sectional shape is formed on a surface of an insulating film on which a semiconductor film is to be formed. Here, a slightly-truncated or rounded triangular shape is also referred to as a triangular shape. Note that cross sections of projections refer to cross sections taken along planes perpendicular to a substrate surface on which a semiconductor film is to be formed, unless otherwise specified.

In order to make the cross sections have a triangular shape, the projections are made to have a conical shape or a triangular prismatic shape. Here, a slightly-truncated or rounded conical shape is also referred to as a conical shape. In the case of a triangular prismatic shape, the projections are formed so that bases of triangular prisms correspond to cross-sections of the projections and one side surface of each triangular prism is parallel to the substrate surface.

The refractive index of the semiconductor film is higher than that of a medium (for example, air, an insulating surface, or the like) in contact with the semiconductor film; therefore, a laser beam having entered the semiconductor film having projections on it surface is reflected at the interface between the air and the projections to travel through a semiconductor film in a zigzag manner. Accordingly, the optical path of a laser beam in a semiconductor film is longer than the thickness of the semiconductor film. That causes the same effects as the case of increasing the thickness of the semiconductor film, and the absorptance of the semiconductor film with respect to a laser beam can be increased.

In order that a laser beam having entered a projection is totally reflected between the air and the interface repeatedly, and a triangular cross section of a projection formed on the semiconductor film surface preferably has a vertical angle, which corresponds to the top of the projection, of 80° or less.

Further, it also applies to the case where a semiconductor film is formed on a surface of an insulating film having projections. A laser beam transmitted through the semiconductor film is totally reflected at the interface between the semiconductor film and the projections of the insulating film; thus, the laser beam remains in the inside of the semiconductor film. In the semiconductor film, the laser beam travels in a zigzag manner while being totally reflected at the interface between the air and the semiconductor film, and between the insulating film and the semiconductor film. Accordingly, the optical path of the laser bean in the semiconductor film is longer; thus, the absorptance of the semiconductor film with respect to the laser beam can be increased.

In order that the laser beam is totally reflected at the interface between the projections an the semiconductor film, the triangular cross section of a projection formed on the insulating film surface preferably has a vertical angle, corresponding to the top of the projection, of 140° or less.

Further, it is another feature of the present invention that a light absorbing film which absorbs a laser beam more efficiently than a semiconductor film is formed over a semiconductor film, and heat absorbed into the light absorbing film is supplied to the semiconductor film. Therefore, a film having high thermal conductivity and a low transmittance with respect to a laser beam is used as the light absorbing film. As the material of the light absorbing film, a metal, an alloy, or a metal compound can be used. Metal elements such as molybdenum (Mo), chromium (Cr), tungsten (W), aluminum (Al), tantalum (Ta), titanium (Ti), nickel (Ni), platinum (Pt), copper (Cu), gold (Au), and silver (Ag) may be used as a material for forming a metal, an alloy or a metal compound.

In order that a laser beam is efficiently absorbed into the light absorbing film, the thickness of the light absorbing film is 100 nm to 600 nm. Preferably, the thickness of the light absorbing film is approximately equal to or less than the wavelength of the laser beam and is equal to or more than ⅓ of the wavelength of the laser beam. The length of the bottom of a triangular cross-section of a projection of the absorbing film is 100 nm to 600 nm. Preferably, the length is almost equal to or less than the wavelength of the laser beam and equal to or more than ⅓ of the wavelength of the laser beam.

Further, another feature of the present invention is that an anti-reflective film is formed over a surface of a semiconductor film, so that a laser beam reflected at the surface of the semiconductor film is reduced; thus, the absorptance of the laser beam at the semiconductor film can be increased. The anti-reflective film is formed of a light-transmitting film having a plurality of projections with a triangular cross-sectional shape on a surface of the light-transmitting film. Therefore, a film formed of a material having high transmittance with respect to a laser beam, which is not melted by being irradiated with the laser beam is used as an anti-reflective film. For example, silicon oxide, silicon nitride, or silicon oxynitride can be used as the material.

In order to realize the effect of preventing reflection of a laser beam with the use of an anti-reflective film, the thickness of the anti-reflective film is 100 nm to 600 nm. Preferably, the thickness is approximately equal to or less than the wavelength of a laser beam and equal to or more than ⅓ of the wavelength of the laser beam. Further, the length of the bottom of a triangular cross section of a projection of the anti-reflective film is 100 nm to 600 nm. Preferably, the length is approximately equal to of less than the wavelength of the laser beam and equal to or more than ⅓ of the wavelength of the laser beam.

In accordance with the present invention, nanoimprinting by which a nanometer-level solid structure can be formed using a transfer technology may be used to form minute projections on a surface of a film such as a semiconductor film. Using nanoimprinting, a resist mask is formed, and a film is etched using the resist mask, thereby forming projections on the film surface.

Note that a state where a semiconductor film is completely melted refers to a state where the semiconductor film is melted to be a liquid from the top surface to the interface with an insulating surface. As mentioned above, in order to form a large grain crystal, a semiconductor film is completely melted by irradiation with a laser beam. A continuous-wave laser or a quasi-continuous-wave laser may be used for the laser. Even irradiation with a pulsed laser may completely melt a semiconductor film as long as the repetition rate of the pulsed laser is 10 MHz or more as in the case of using a continuous-wave laser.

The wavelength of the laser beam is determined in consideration of the skin depth of a laser beam and the thickness of the semiconductor film to be crystallized. In order to completely melt the semiconductor film to obtain a large grain crystal, it is preferable that the wavelength of the laser beam is in a range of 400 nm to 565 nm, and a continuous-wave laser or a quasi-continuous-wave laser is used. For example, as laser beams having such a wavelength range, there are a second harmonic (532 nm) of a $YVO_4$ laser, a second harmonic (532 nm) of a YAG laser, and a second harmonic (527 nm) of a YLF laser. Note that the $YVO_4$ laser as given as an example above and the like may be a continuous-wave laser, a pulsed laser, or a quasi-continuous-wave laser.

A semiconductor film which is to be irradiated with a laser beam may have a crystal structure of a non-single crystal. For example, it has an amorphous, a microcrystalline, or a polycrystalline structure. The semiconductor film is generally a film containing silicon as a main component or a film containing germanium as a main component, for example, a silicon film or a compound film of silicon and germanium is used. The semiconductor film is formed by CVD or sputtering. Further, the semiconductor film may contain an n-type impurity such as P (phosphorus) or As (arsenic), or a p-type impurity such as B (boron).

A substrate over which a semiconductor film is to be formed may be, for example, a substrate formed of an insulating material, such as a glass substrate, a quartz substrate, a sapphire substrate, or a plastic substrate; a conductive substrate such as a stainless-steel substrate; a semiconductor substrate; or the like. In the case where a conductive substrate such as a stainless-steel substrate, or a semiconductor substrate is used, an insulating film covering the top surface is preferably formed, so that a semiconductor film is formed on an insulating surface. Further, also in a case where a substrate containing a material which contaminates the semiconductor film, such as a glass substrate or a plastic substrate is used, it is preferable that the top surface of the substrate is covered with an insulating film such that the substrate is not contaminated. Further, when an insulating film is formed thickly, heat is hardly conducted to the substrate. A single film or a stack of silicon oxide, silicon nitride, or silicon oxynitride can be used for the insulating film to be formed on the top surface of the substrate. Such an insulating film can be formed by CVD or sputtering.

In accordance with the present invention, the energy of a laser beam can be efficiently absorbed into the semiconductor film, so that a thin semiconductor film having a thickness of 50 nm or less can be completely melted and crystallized. Therefore, a thin crystalline semiconductor film with a thickness of 50 nm or less, which has a large grain crystal can be formed. Further, the amount of energy of a laser beam, which is required for complete melting can be reduced; thus, a load on a laser is reduced and the energy of the laser beam can be easily optimized.

A channel formation region is formed from a large grain crystal obtained by a crystallization method of the present invention; thus, a thin film transistor having a high field-effect mobility can be manufactured. Further, the channel formation region can be thinned to 50 nm or less; thus, the power consumption of the thin film transistor can be reduced. When an integrated circuit is formed using such a thin film transistor, a multifunction semiconductor device with high performance and low power consumption can be manufactured.

BRIEF DESCRIPTION OF THE DRAWINGS

In the accompanying drawings:
FIGS. 15A to 15D are diagrams for illustrating a method of manufacturing a semiconductor device having a function of wireless communication;
FIGS. 16A to 16D are diagrams for illustrating a method of manufacturing a semiconductor device having a function of wireless communication;
FIGS. 17A to 17C are diagrams for illustrating a method of manufacturing a semiconductor device having a function of wireless communication;
FIGS. 18A and 18B are diagrams for illustrating a method of manufacturing a semiconductor device having a function of wireless communication;
FIGS. 21A and 21B are a front view of a structure example of a liquid crystal module and a cross-sectional view thereof, respectively;
FIGS. 23A to 23F are general views illustrating examples of semiconductor devices in which a liquid crystal module or an EL module is mounted on a display portion.

DETAILED DESCRIPTION OF THE INVENTION

Crystallization methods of a semiconductor film in accordance with the present invention will be described below with reference to the drawings. Note that, it is easily understood by those skilled in the art that the present invention can be implemented with many different modes, and the forms and details can be variously changed without departing from the sprint and scope of the invention. Therefore, the invention is not construed as being limited to the description of the embodiment modes and the embodiments.

Embodiment Mode 1

In this embodiment mode, a method of crystallizing a semiconductor film by forming projections having a triangular cross sections are on a surface of a semiconductor film will be described. A crystallization method of a semiconductor film will be described with reference to FIG. 1A to FIG. 5.

Figure 1A:
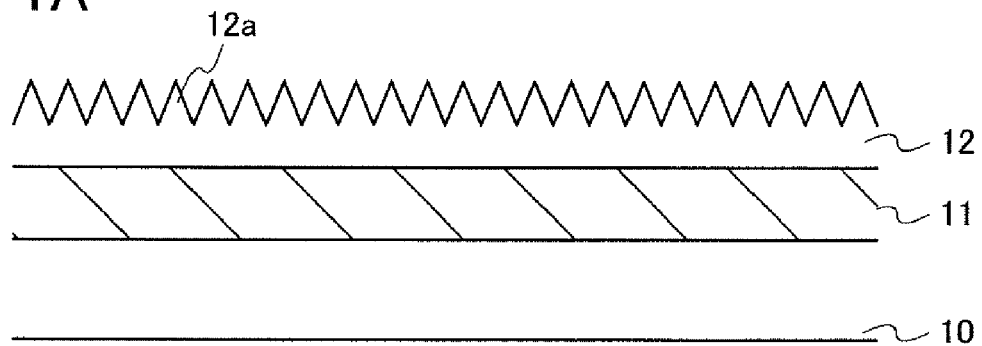
FIGS. 1A to 1D are cross-sectional views illustrating a method of crystallizing a semiconductor film and a method of manufacturing a semiconductor device.

As shown in FIG. 1A, an insulating film 11 to be a base is formed on a substrate 10. As the insulating film 11, a single layer film or a multilayer film of silicon oxide, silicon nitride, silicon nitride oxide, or silicon oxynitride is formed by plasma CVD or sputtering. The thickness of the insulating film 11 is 50 nm to 200 nm. A semiconductor film 12 is formed on the insulating film 11. For example, in the case of forming a silicon film, the semiconductor film can be formed by plasma CVD, LPCVD, or thermal CVD using silane ($SiH_4$) or disilane ($Si_2H_6$) which are diluted with hydrogen as a source gas, or the like. When a silicon film is doped with germanium, $GeH_4$ may be added to the source gas. Further, when a silicon film is formed by sputtering, a silicon (Si) target may be used, and when germanium is added, the target may be doped with Ge.

Figure 2:
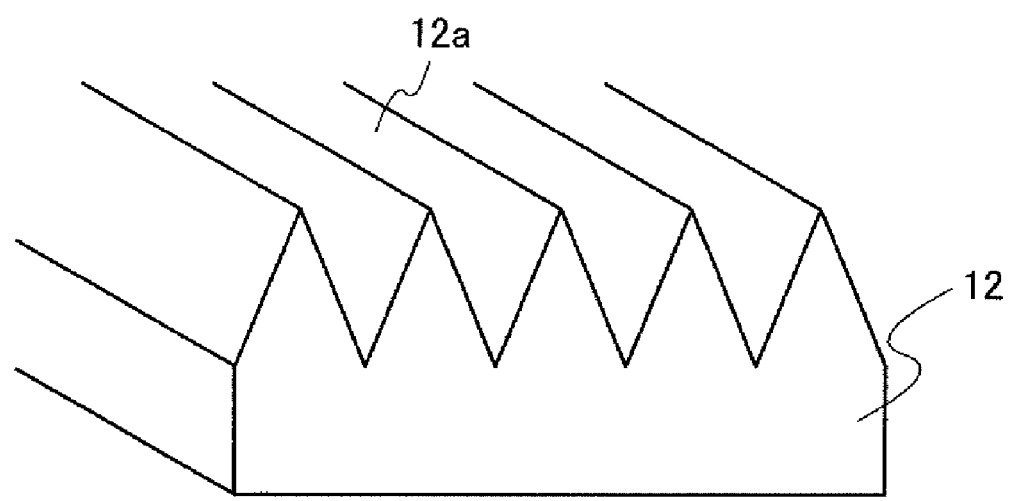
FIG. 2 is a perspective view illustrating the shapes of projections on a surface of a semiconductor film.
Figure 3:
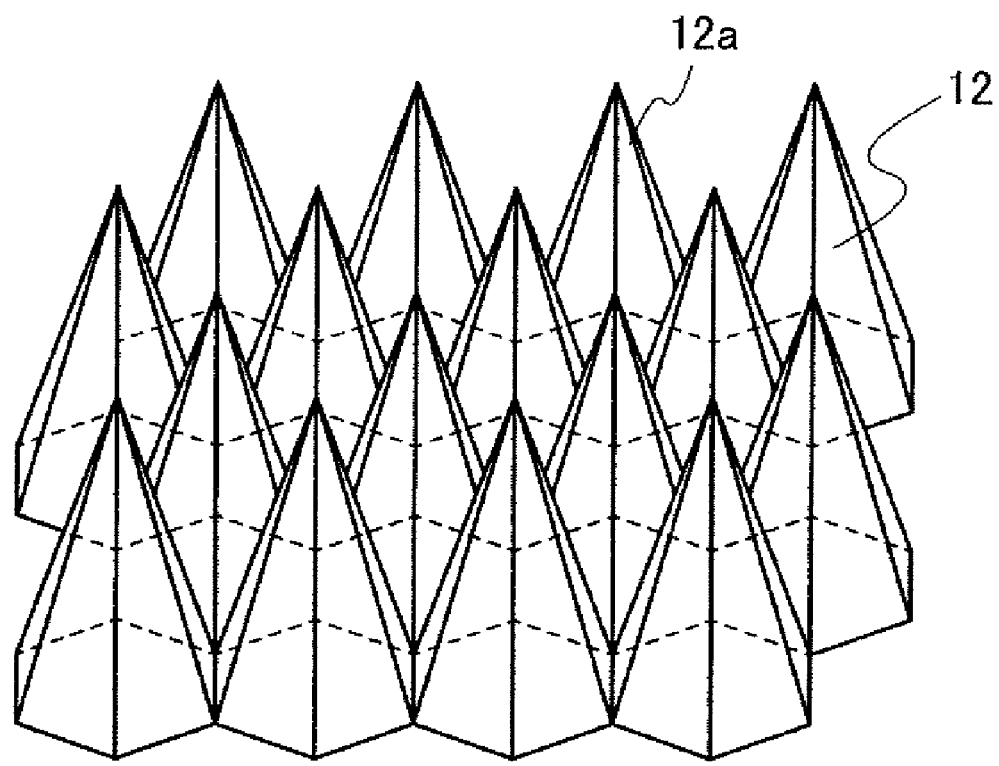
FIG. 3 is a perspective view illustrating the shapes of projections on a surface of a semiconductor film.

Next, a projection 12a having a triangular cross section is formed on a surface of the semiconductor film 12. For example, a mask is formed with a photoresist by a nanoimprinting method, and the semiconductor film 12 is dry-etched using the mask. Note that the projection 12a on the surface of the semiconductor film 12 may have a triangular prismatic shape as shown in FIG. 2 or a conical shape as shown in FIG. 3. The cross section of the projection 12a may have a triangular shape; thus, the conical shape may be either a pyramidal shape or a circular conical shape. FIG. 3 shows an example of a regular hexagonal pyramid.

The projection 12a is preferably formed such that there is no or few planes parallel to the substrate on a surface of the semiconductor film 12. That is because when a laser beam LB enters inside the semiconductor film 12 from the projection 12a, the absorptance is improved. FIG. 2 and FIG. 3 illustrate examples of forming the projection 12a such that there is no plane parallel to the substrate on a surface of the semiconductor film 12. When the projection 12a is a cone, a triangular pyramid, a quadrangular pyramid, a hexagonal pyramid, or the like which can fill the plane on the semiconductor are preferably used.

Figure 1B:
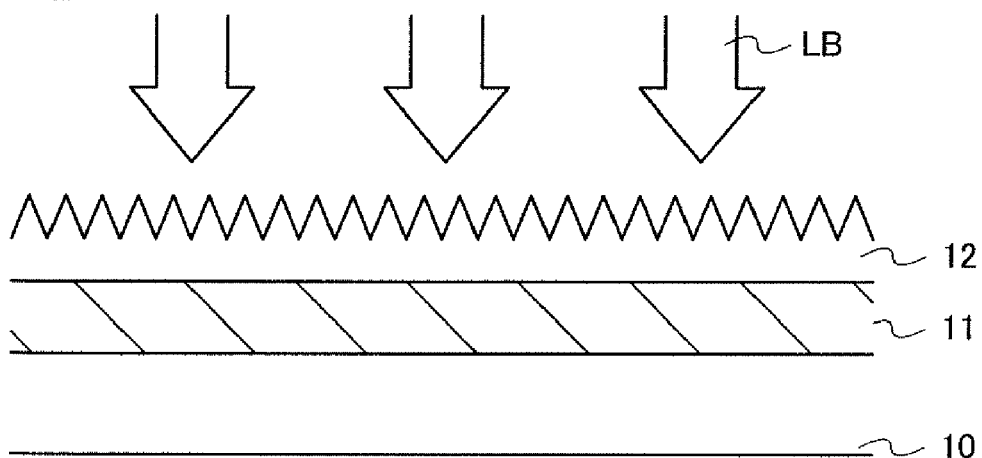

After forming the projection 12a on a surface of the semiconductor film 12, as shown in FIG. 1B, the laser beam LB is delivered from above the semiconductor film 12. Since the laser beam LB emitted from an oscillator has a point shape, the laser beam is shaped to be linear on an irradiation surface using an optical system having a cylindrical lens or the like. Irradiation is performed while scanning the linear laser beam LB in the direction parallel to the short side direction. As in the case where silane or the like is used for the source gas, there are cases where the semiconductor film 12 may contain hydrogen depending on the film formation method. When the laser beam LB is applied, in order to prevent hydrogen from issuing from the semiconductor film 12, dehydrogenation is performed by heating of the semiconductor film 12 at 400° C. to 550° C. for approximately 1 hour or more.

Figure 4:
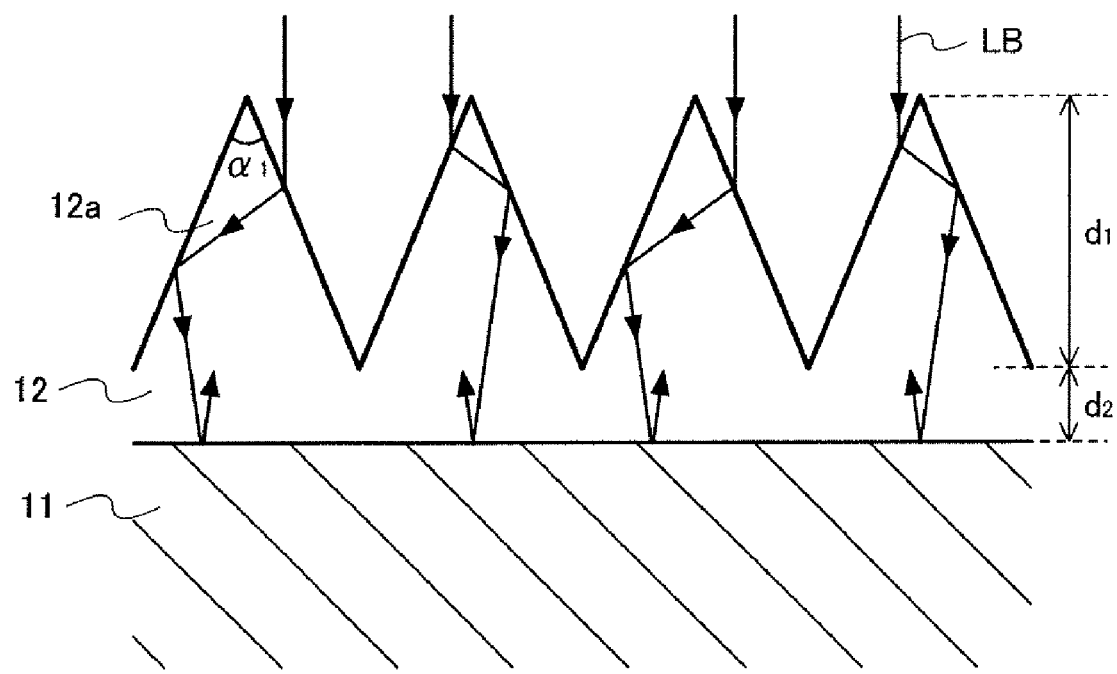
FIG. 4 is a cross-sectional view of a magnified diagram of FIG. 1B, which illustrates a function of projections on a surface of the semiconductor film.

Functions of the projection 12a of the semiconductor film 12 will be described with reference to FIG. 4. The refractive index of silicon is significantly high as approximately 4. Accordingly, a laser beam LB which has entered the projection 12a of the semiconductor film 12 is greatly refracted and travels toward the substrate 10 while being totally reflected at the interface between the projection 12a and the air. That is, since the laser beam LB travels in the projection 12a of the semiconductor film 12 in a zigzag manner, the optical path is longer than the thickness of the semiconductor film 12. Increase in the optical path length in the semiconductor film 12 corresponds to the case where the semiconductor film 12 is made thicker; thus, absorptance of the semiconductor film 12 is increased.

Further, since the laser beam LB enters inside the semiconductor film 12 from the projection 12a, the probability of total reflection of the incident laser beam at the interface between the insulating film 11 and the semiconductor film 12 is increased, and further, the totally reflected laser beam LB is totally reflected at the interface between the semiconductor film 12 and the air again. Therefore, the time during which the laser beam LB propagates through the semiconductor film 12 is longer, and the amount of light which is absorbed into the semiconductor film as heat is increased.

One of two effects of providing the projection 12a is that the laser beam is totally reflected at the projection 12a, and the other is that the laser beam is totally reflected at the interface between the insulating film 11 and the semiconductor film 12 and the interface between the air and the semiconductor film 12, thereby trapping the laser beam inside the semiconductor film 12. Due to the effects, the absorptance of the semiconductor film 12 can be improved.

The refractive indices of the air and the semiconductor film 12, and the insulating film 11 are approximately 1, approximately 3 to 5, and approximately 1.4 to 1.6, respectively; therefore, in order to realize the effect of the projection 12a, the vertical angle $\alpha_1$ of the triangular cross section of the projection 12a cross section is 80° or less. Further, the height $d_1$ of the projection 12a (the thickness $d_1$ of an area where the thickness of the semiconductor film 12 changes) is thicker than the thickness $d_2$ of an area where the thickness of the semiconductor film 12 does not change, preferably, the former is twice or more thicker than the latter. Further, it is also possible that the thickness $d_2$ is almost 0, and the semiconductor film 12 is formed of only the projection 12a.

Figure 1C:
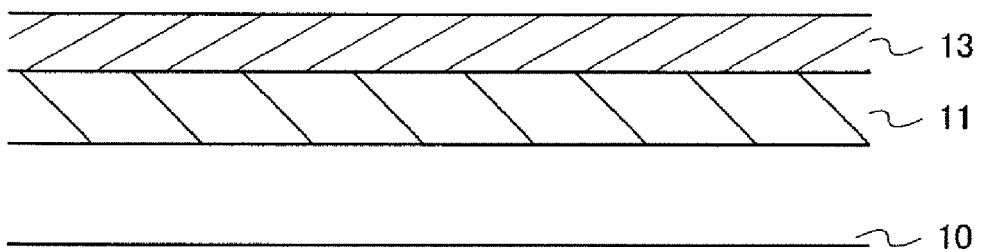

Due to the functions of the projection 12a, the absorptance of the laser beam LB at the semiconductor film 12 can be improved; therefore, a crystalline semiconductor film 13 having a thickness of 50 nm, which is formed from a large grain crystal can be formed by totally melting the semiconductor film 12 with the laser beam LB. The semiconductor film 12 is totally melted, so that as shown in FIG. 1C, the surface of the crystalline semiconductor film 13 is planarized after the melting. Note that since light travels fast, during when the laser beam is totally reflected at the projection 12a, the shape of the projection 12a can be kept without melting the projection 12a; thus, the function of the projection 12a can be realized.

The thickness of the semiconductor film 12 before being crystallized can be determined in consideration of the thickness D of the crystalline semiconductor film 13 after crystallization. In the case where the projection 12a is a triangular prism as shown in FIG. 2, Equation $D=d_1/2+d_2$ may be considered, in the case where the projection 12a is conical as shown in FIG. 3, Equation $D=d_1/3+d_2$ may be considered. In addition, the density of the semiconductor film 12 before crystallization and the density of the crystalline semiconductor film 14 after the crystallization may be considered. As seen from the above two equations, when the projection 12a is provided, a total thickness of the semiconductor film 12 before crystallization can be increased. In particular, as $d_2$ is minimized, the total thickness of the semiconductor film 12 can be increased.

Figure 1D:
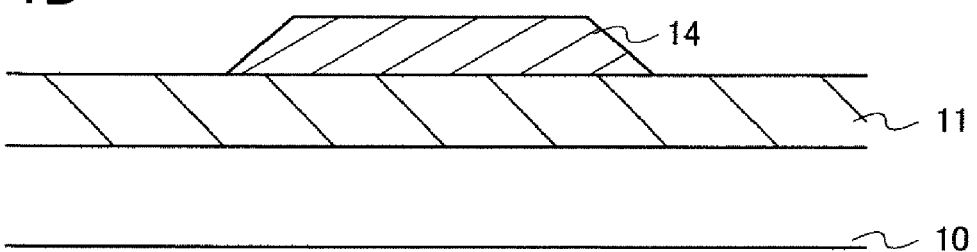

As shown in FIG. 1D, the crystalline semiconductor film 14 is processed into an island shape by photolithography and etching to form an island-shaped crystalline semiconductor film. Semiconductor elements such as a transistor, a diode, a capacitor, and a nonvolatile memory element are formed using the crystalline semiconductor film 14. Such semiconductor elements are combined to form various semiconductor devices, for example, an integrated circuit and the like.

Figure 5:
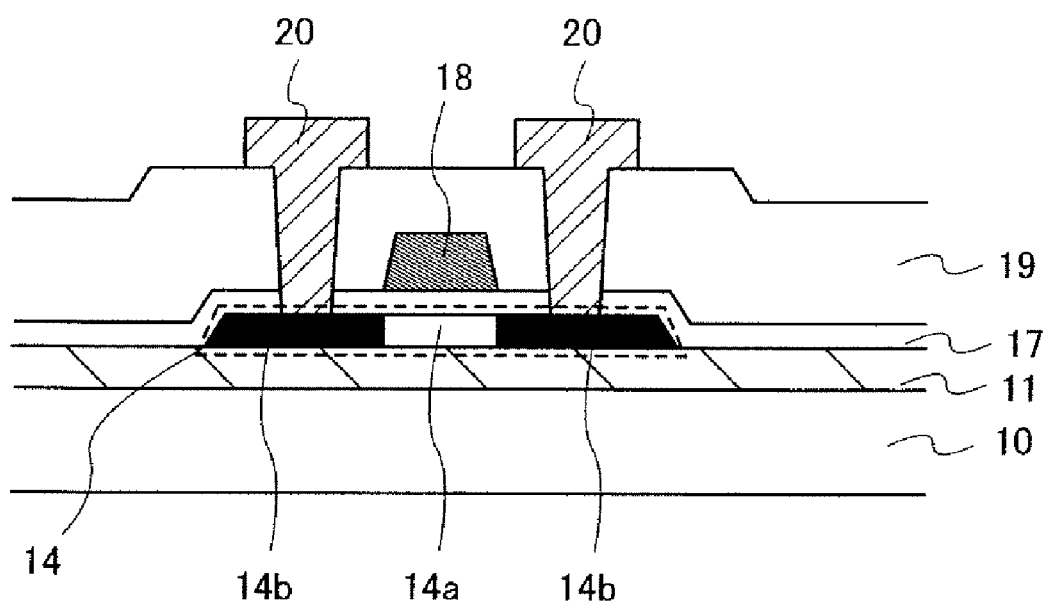
FIG. 5 is a cross-sectional view of a thin film transistor using a crystalline semiconductor film.

For example, as shown in FIG. 5, a thin film transistor is formed using the island-shaped crystalline semiconductor film 14. A gate insulating film 17 is formed on the crystalline semiconductor film 14 and a gate electrode 18 is formed on the gate insulating film 17. An n-type or p-type impurity is added to the island-shaped crystalline semiconductor film 14, thereby forming a high concentration impurity region 14b. Accordingly, a channel formation region 14a is settled in the island-shaped crystalline semiconductor film 14. An interlayer insulating film 19 is formed over the gate electrode 18. A contact hole is formed through the interlayer insulating film 19 and the gate insulating film 17 so as to reach the island-shaped crystalline semiconductor film 14. An electrode 20 is formed over the interlayer insulating film 19, and the electrode 20 is connected to the high concentration impurity region 14b. Through the above steps, a thin film transistor is manufactured.

When the channel formation region 14a is formed with a large grain crystal, a thin film transistor having high field effect mobility can be manufactured. Further, since the channel formation region 14a can be made with a thin thickness as 50 nm or less, a subthreshold swing (S value) is improved and the absolute value of a threshold voltage reduced; thus, drive voltage can be reduced. Using such a thin film transistor, a multifunction semiconductor device with high performance and low power consumption can be manufactured.

Embodiment Mode 2

In this embodiment mode, a method of crystallizing a semiconductor film, in which the semiconductor film is formed on an insulating film having a triangular cross section on its surface will be described. A crystallization method of a semiconductor film will be described with reference to FIGS. 6A to 6D and FIG. 7.

Figure 6A:
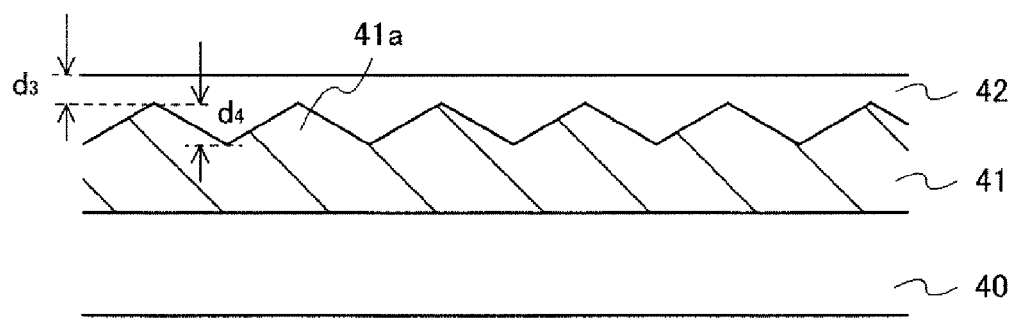
FIGS. 6A to 6D are cross-sectional views illustrating a method of crystallizing a semiconductor film and a method of manufacturing a semiconductor device.

As shown in FIG. 6A, an insulating film 41 to be a base is formed over a substrate 10. As the insulating film 41, a single layer film or a multilayer film of a silicon oxide film, a silicon nitride film, and/or a silicon oxynitride film is formed by plasma CVD or sputtering. The thickness of the insulating film 41 is 10 nm to 200 nm.

Figure 6B:
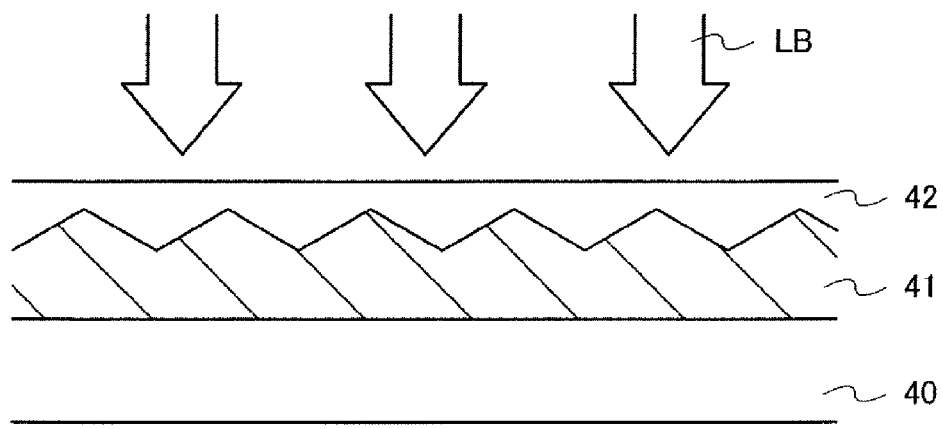
Figure 6C:
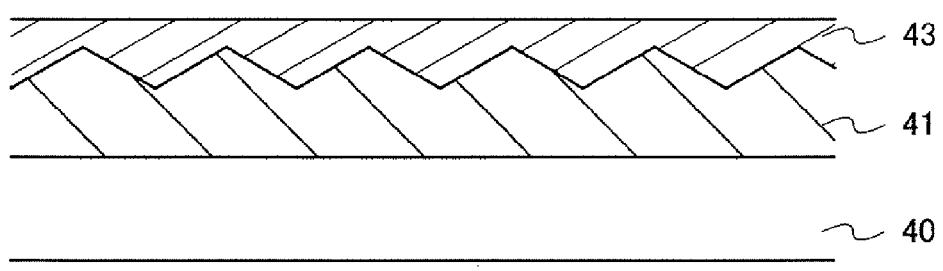

Next, as shown in FIG. 6B, a projection 41a having a triangular cross section is formed on the surface of the insulating film 41. For example, a mask is formed from a photoresist by a nanoimprinting method, and the insulating film 41 is dry-etched using the mask. Note that the shape of the projection 41a on the surface of the insulating film 41 is a triangular prismatic shape or a conical shape as the projection 12a of the semiconductor film 12 shown in FIG. 1A (See FIG. 2 and FIG. 3). Further, arrangement is similar to the projection 12a, and the projection 41a is formed such that no or few planes of the surface of the insulating film 41 are parallel to the surface of the substrate 10.

As shown in FIG. 6A, a semiconductor film 42 is formed in contact with the insulating film 41. As the semiconductor film 42, a silicon film, a germanium film, or a silicon film containing germanium is formed by plasma CVD, LPCVD, thermal CVD, or sputtering. In the example of FIGS. 6A to 6D, since the base of the semiconductor film 42 is not flat, the surface of the semiconductor film 42 is preferably planarized by a polishing method such as CMP after it is formed. Part of the planarized semiconductor film 42, which does not include the projection 41a has a thickness $d_3$ of 10 nm to 50 nm. Further, a thickness $d_4$ of the projection 41a is preferably 10 nm to 50 nm.

As shown in FIG. 6B, the semiconductor film 42 is irradiated with a linear laser beam LB from above the semiconductor film. The semiconductor film 42 is dehydrogenated as necessary by heat treatment at 400° C. to 550° C. for one about hour or more before being irradiated with the laser beam LB.

Functions of the projection 41a of the insulating film 41 will be described with reference to FIG. 7. Since the refractive index of silicon is high as approximately 4 and the refractive index of germanium is also high as approximately 3, a beam which has entered the semiconductor film 42 travels toward the insulating film 41 from the direction almost perpendicular to the surface of the substrate 10. The laser beam LB which has reached the interface between the semiconductor film 42 and the projection 41a of the insulating film 41 is totally reflected at the interface. The laser beam is totally reflected at the interface between the projection 41a and the semiconductor film 42; thus, the optical path is deflected so that the laser beam travel toward the top face of the semiconductor film 42. The laser beam LB is totally reflected at the interface between the air and the top face of the semiconductor film 12 as well and deflected again in the direction of the insulating film 41.

Figure 7:
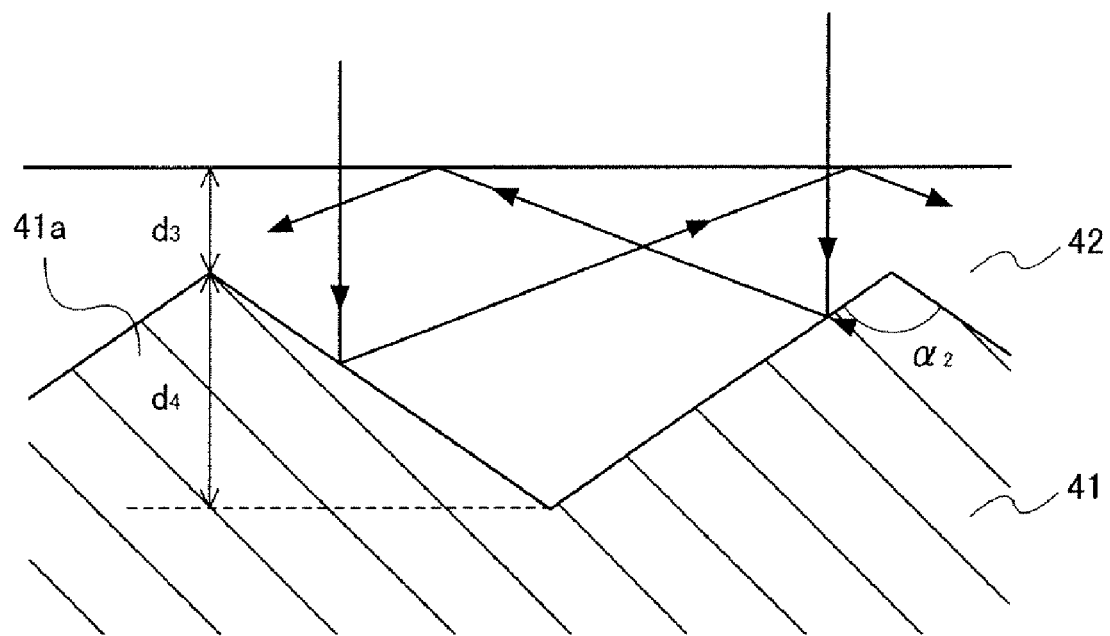
FIG. 7 is a cross-sectional view of a magnified diagram of FIG. 6B, which illustrates a function of projections on a surface of the semiconductor film.

As shown in FIG. 7, since the laser beam travels inside the semiconductor film 42 in a zigzag manner while being totally reflected, so that the period during which the laser beam LB propagates through the semiconductor film 42 is longer; thus, the absorptance of the semiconductor film 42 can be improved. Specifically, in this embodiment mode, a laser beam LB which has been transmitted through the semiconductor film 42 conventionally is totally reflected at the projection 41a thereby trapping the laser beam LB in the semiconductor film 42; thus, it is absorbed in the semiconductor film 42 as heat.

Since the refractive index of the semiconductor film 42 is approximately 3 to 5, and that of the insulating film 41 is approximately 1.4 to 1.6, the vertical angle $\alpha_2$ of a triangular cross section of the projection 41a is preferably 140° or less in order to realize the effect of totally reflecting the laser beam at the interface between the projection 41a and the semiconductor film 42.

Due to the functions of the projection 41a, the laser beam LB is absorbed in the semiconductor film 42, so that the semiconductor film 42 can be totally melted. Therefore, a crystalline semiconductor film 43 formed from a large grain crystal can be formed by the irradiation with the laser beam LB (See FIG. 6C).

Figure 6D:
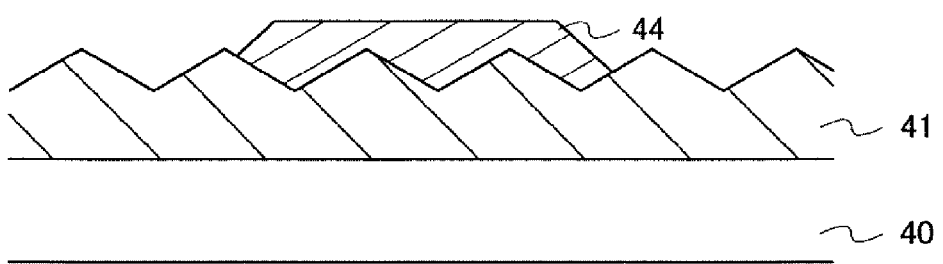

As shown in FIG. 6D, the crystalline semiconductor film 43 is processed into an island shape by photolithography and etching, thereby forming an island-shaped crystalline semiconductor film 44. Using the crystalline semiconductor film 44, for example, a thin film transistor as shown in FIG. 5 can be formed. Further, other than a transistor, semiconductor elements such as a diode, a capacitor, and a nonvolatile memory element can be formed. Such semiconductor elements are combined to form various semiconductor devices, for example, an integrated circuit and the like.

Embodiment Mode 3

In this embodiment mode, a method of crystallizing a semiconductor film, in which a light absorbing film having a projection with a triangular cross section on the semiconductor film will be described. A crystallization method of a semiconductor film will be described with reference to FIGS. 8A to 8C and FIGS. 9A and 9B.

Figure 8A:
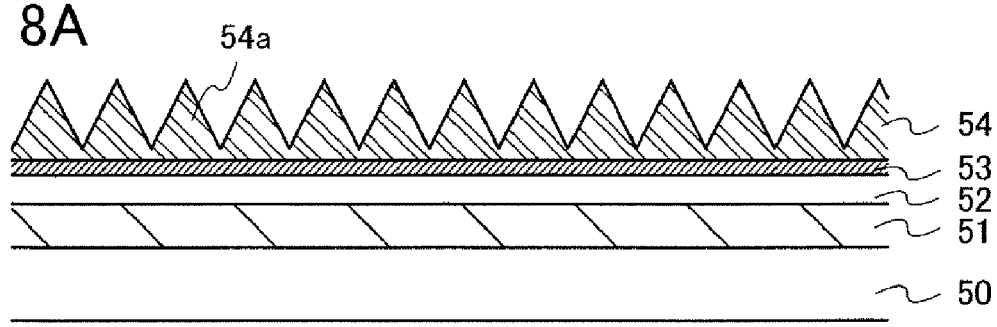
FIGS. 8A to 8C are cross-sectional views illustrating a method of manufacturing a semiconductor device.

As shown in FIG. 8A, an insulating film 51 to be a base is formed on a substrate 50 as in Embodiment Mode 1, and a semiconductor film 52 is formed on the insulating film 51. Note that in this embodiment mode, a projection is not formed on the surface of the semiconductor film 52. The thickness of the semiconductor film 52 is 10 nm to 50 nm.

Next, a light absorbing film 54 is formed on the semiconductor film 52. The light absorbing film 54 is a film for absorbing a laser beam as heat and transmitting the absorbed heat to the semiconductor film. Accordingly, a film which has high heat conductivity and low transmittance with respect to a laser beam is used as the light absorbing film 54. As the material of the light absorbing film 54, a metal, an alloy, and/or a metal compound can be used. As metal elements for forming the metal, alloy, or metal compound, molybdenum (Mo), chromium (Cr), tungsten (W), aluminum (A), tantalum (Ta), titanium (Ti), nickel (Ni), platinum (Pt), copper (Cu), gold (Au), silver (Ag), or the like can be used.

It is not preferable that a film formed from such a material is formed in contact with the semiconductor film 52. Therefore, a protection insulating film 53 is formed with a thickness of 10 nm to 100 nm on the surface of the semiconductor film 52. As the protective insulating film 53, a single layer film or a multilayer film of silicon oxide, silicon nitride, or silicon oxynitride is formed by plasma CVD or sputtering.

After the protective insulating film 53 is formed, a film forming the light absorbing film 54 is formed. In this embodiment mode, a molybdenum film is formed by sputtering. A projection 54*a* is formed to have a triangular cross section, on the surface of the molybdenum film, thereby forming a light absorbing film 54. The projection 54*a* is formed by forming a mask with a photoresist by a nanoimprinting method and dry-etching the surface of the molybdenum film using the mask. Note that the shape of the projection 54*a* on the surface of the light absorbing film 54 is a triangular prismatic shape or a conical shape as the semiconductor film 12 of the projection 12*a* of in FIG. 1A (See FIG. 2 and FIG. 3). Further, arrangement is also similar to the projection 12*a*, and the projection 54*a* is formed such that no or few planes of the surface of the light absorbing film 54 are parallel to the surface of the substrate 50.

Figure 8B:
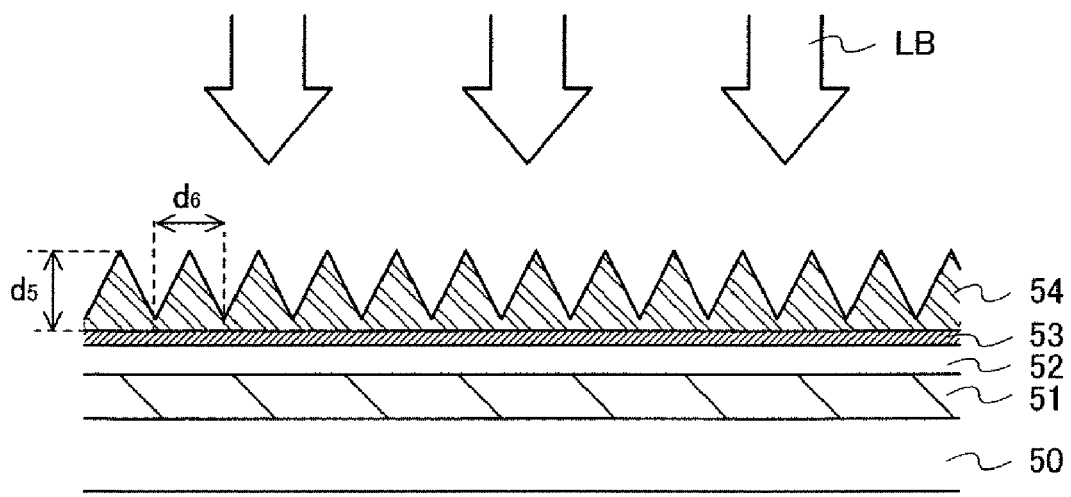

After the projection 54*a* is formed on the surface of the light absorbing film 54, the semiconductor film 52 is irradiated with a laser beam LB from above the semiconductor film 52 as shown in FIG. 8B. The semiconductor film 52 and the protective insulating film 53 are dehydrogenated as necessary before being irradiated with the laser beam LB.

Figure 8C:
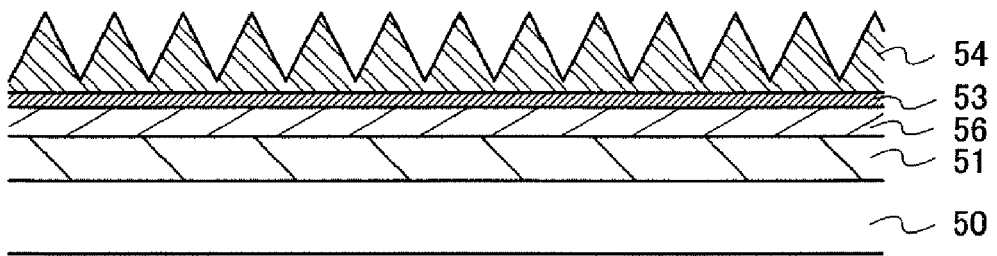

Most of the emitted laser beam LB is absorbed in the light absorbing film 54 and the light absorbing film 54 is heated. The light absorbing film 54 is heated, so that the temperature or the semiconductor film 52 also rises, and totally melted. Thus, a crystalline semiconductor film 56 having a large grain crystal can be formed as shown in FIG. 8C. In this manner, the energy of the laser beam LB can be efficiently supplied to the semiconductor film 52 as heat by using the light absorbing film 54; therefore, the output power of the laser can be reduced.

In order to reduce reflection of the laser beam LB at the surface of the light absorbing film 54, the thickness $d_5$ (height $d_5$ of the projection 54*a*) of the light absorbing film 54 and the length $d_6$ of the base of a triangular cross section of the projection 54*a* is approximately equal to the wavelength $\lambda$ of the laser beam LB or less, and may be 100 nm to 600 nm. The ranges of $\frac{1}{3}\lambda \leq d_5 \leq \lambda$ and $\frac{1}{3}\lambda \leq d_6 \leq \lambda$ are more preferable.

Figure 9A:
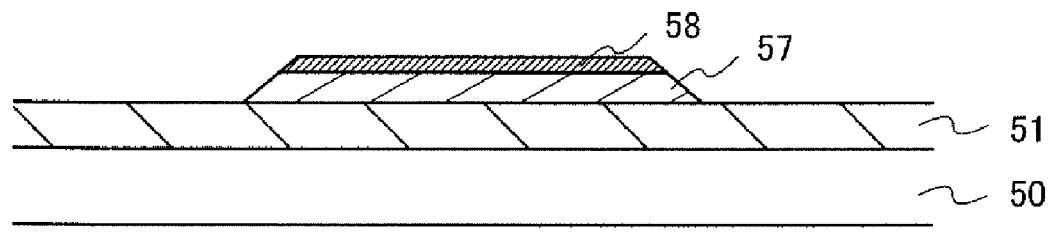
FIGS. 9A and 9B are cross-sectional views illustrating a method of manufacturing a semiconductor device.

After the irradiation with the laser beam LB, the light absorbing film 54 is etched away. When the protective insulating film 53 is used for a film to be used as a part of a semiconductor element, such as a gate insulating film, the protective insulating film 53 and the crystalline semiconductor film 56 are processed into island shapes by photolithography and etching, thereby forming an island-shaped crystalline semiconductor film 57 and an island-shaped insulating film 58 as shown in FIG. 9A. When the protective insulating film 53 is not used as a film forming a semiconductor element, the protective insulating film 53 is removed, and the crystalline semiconductor film 56 is processed into an island shape by photolithography and etching, thereby forming the island-shaped crystalline semiconductor film 57 as shown in FIG. 9B.

Figure 9B:
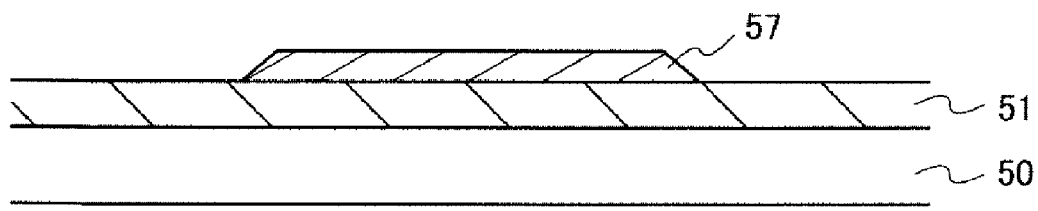

Using the crystalline semiconductor film 57 shown in FIG. 9A and FIG. 9B, for example, a thin film transistor as shown in FIG. 5 can be formed. The island-shaped insulating film 58 shown in FIG. 9A is to form the gate insulating film 17 of the thin film transistor. Other than a transistor, semiconductor elements such as a diode, a capacitor, and a nonvolatile memory element can be formed. Such semiconductor elements are combined to form various semiconductor devices, for example, an integrated circuit and the like.

Embodiment Mode 4

In this embodiment mode, a method of crystallizing a semiconductor film, in which an antireflective film having a triangular cross section is formed on a surface of the semiconductor film will be described. A crystallization method of a semiconductor film will be described with reference to FIGS. 10A to 10D.

Figure 10A:
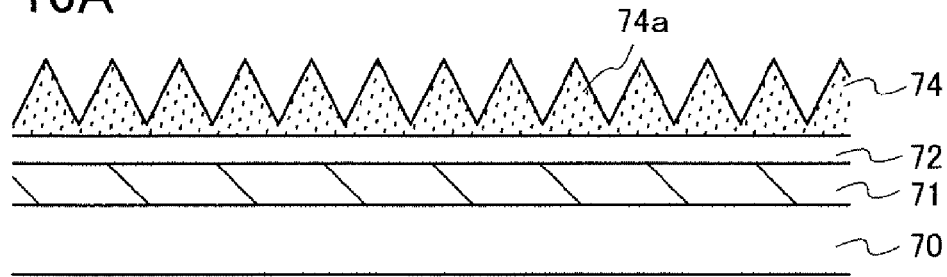
FIGS. 10A to 10D are cross-sectional views illustrating a method of crystallizing a semiconductor film and a method of manufacturing a semiconductor device.

As shown in FIG. 10A, an insulating film 71 to be a base is formed on a substrate 70 as in Embodiment Mode 1, and a semiconductor film 72 is formed on the insulating film 71. Note that in this embodiment mode, a projection is not formed on the surface of the semiconductor film 72. The thickness of the semiconductor film 72 is 10 nm to 50 nm.

Next, a light-transmitting film forming an anti-reflective film 74 is formed. The semiconductor film 72 is irradiated with a laser beam LB through the anti-reflective film 74; therefore, the anti-reflective film 74 is formed from a material having high transmissivity with respect to the laser beam LB, which is not melted by being irradiated with the laser beam LB. For example, a single layer film or a multilayer film of insulating materials such as silicon oxide, silicon nitride, and silicon oxynitride can be used for the anti-reflective film 74. Such films are formed by plasma CVD or sputtering.

In this embodiment mode, a silicon oxide film is formed by CVD. A projection 74*a* is formed to have a triangular cross section, on the surface of the silicon oxide film, thereby forming the anti-reflective film 74. The projection 74*a* is formed by forming a mask with a photoresist by a nanoimprinting method and dry-etching the surface of the molybdenum film using the mask. Note that the shape of the projection 74*a* on the surface of the anti-reflective film 74 is a triangular prismatic shape or a conical shape as the semiconductor film 12 of the projection 12*a* of in FIG. 1A (See FIG. 2 and FIG. 3). Further, arrangement is also similar to the projection 12*a*, and the projection 74*a* is formed such that no of few planes of the surface of the light absorbing film 74 are parallel to the surface of the substrate 70.

Figure 10B:
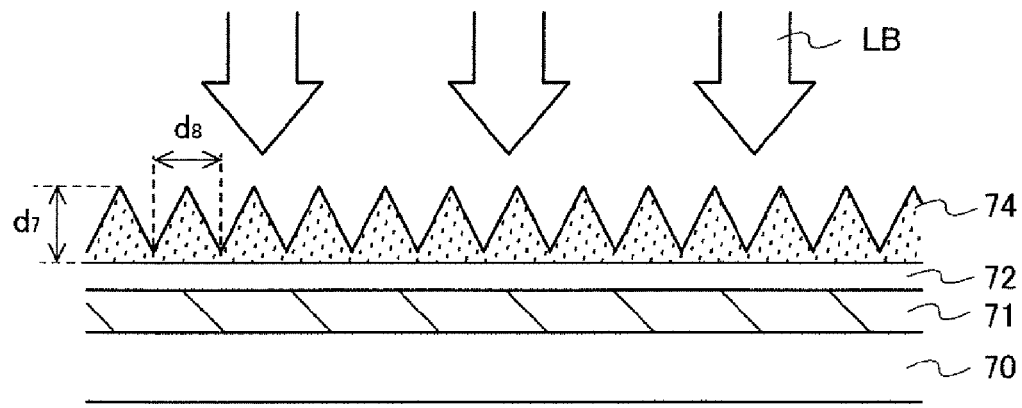

After the projection 74*a* is formed on the surface of the anti-reflective film 74, the semiconductor film 72 is irradiated with a laser beam LB from above the semiconductor film 72 as shown in FIG. 10B. The semiconductor film 72 and the anti-reflective film 73 are dehydrogenated as necessary before being irradiated with the laser beam LB.

Most of the laser beam LB emitted from above is refracted by the projection 74*a* without being reflected at the projection 74*a* of the anti-reflective film 74. Specifically, when the antireflective film 74 is not provided, light reflected at the surface of the semiconductor film 72 can be made to enter the semiconductor film 72 by the provision of the anti-reflective film 74. Accordingly, the reflectance of the semiconductor film 72 is reduced, and the absorptance would increase. Thus, the semiconductor film 72 with a thickness of 50 nm or less can be totally melted without high output power of a laser.

In order to reduce reflection of the laser beam LB at the projection 74a, the thickness $d_7$ (height $d_7$ of the projection 74a) of the anti-reflective film 74 and the length $d_8$ of the base of a triangular cross section of the projection 74a is approximately equal to the wavelength λ of the laser beam LB or less, and may be 100 nm to 600 nm. The ranges of $\frac{1}{3}\lambda \leq d_7 \leq \lambda$ and $\frac{1}{3}\lambda \leq d_8 \leq \lambda$ are more preferable.

Figure 10C:
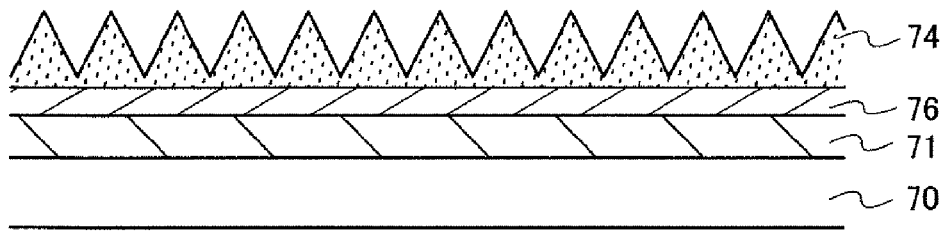
Figure 10D:
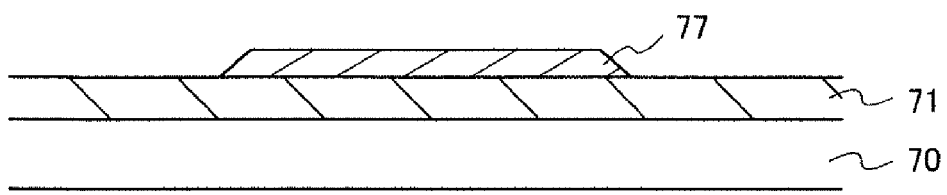

After a crystalline semiconductor film 76 is formed by irradiation with a laser beam LB as shown in FIG. 10C, the anti-reflective film 74 is etched away. As shown in FIG. 10D, the crystalline semiconductor film 76 is processed into an island shape by photolithography and etching, thereby forming an island-shaped crystalline semiconductor film 77. Using the crystalline semiconductor film 77, for example, a thin film transistor as shown in FIG. 5 can be formed. Note that other than a transistor, semiconductor elements such as a diode, a capacitor, and a nonvolatile memory element can be formed. Such semiconductor elements are combined to form various semiconductor devices, for example, an integrated circuit and the like.

Embodiment 1

In this embodiment, an example of a method of manufacturing a nonvolatile memory element, which is a semiconductor element, will be explained with reference to FIGS. 11A to 11D and 12A to 12D.

A nonvolatile memory element in this embodiment has a similar structure to that of a MOSFET (Metal Oxide Semiconductor Field Effect Transistor), in which a region capable of accumulating charges for a long period of time is provided over a channel formation region. This charge accumulating region is formed over an insulating film and insulated from its periphery; therefore, it is also referred to as a floating gate electrode. A control gate electrode is formed over the floating gate electrode with an insulating film interposed therebetween.

The nonvolatile memory element having the aforementioned structure accumulates charges in the floating gate electrode and releases the charges, based on the voltage applied to the control gate electrode. That is to say, the nonvolatile semiconductor memory device has a mechanism of storing data by taking charges into and out of the floating gate electrode. The injection and extraction of the charges to and from the floating gate electrode are performed by applying a high voltage between the control gate electrode and the semiconductor film provided with the channel formation region. It is said that Fowler-Nordheim type (F-N type) tunneling current (NAND-type) or a thermal electron (NOR-type) flows through the insulating film over the channel formation region at this time. The insulating film formed over the channel formation region is also called a tunnel insulating film.

Figure 11A:
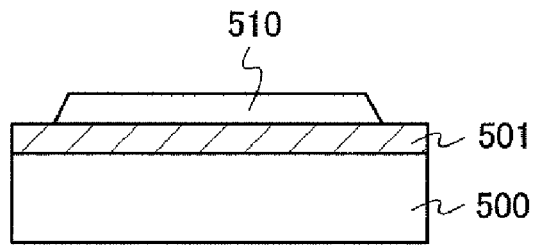
FIGS. 11A to 11D are diagrams for illustrating a method of forming a nonvolatile memory element.

First, as shown in FIG. 11A, an insulating film 501 to be a base is formed over a substrate 500. A crystalline silicon film is formed on the insulating film 501 using a crystallization method in any one of Embodiment Modes 1 to 4, and an island-shaped crystalline semiconductor film 510 is formed by photolithography and etching. Note that in this embodiment, a crystallization method in which projections are not formed on the base insulating film 501 as described in Embodiment Modes 1, 3, and 4 is used. When the crystallization method of Embodiment Mode 2 is used, a projection having a triangular cross section is formed on the insulating film 501. The thickness of the crystalline semiconductor film 510 is 50 nm or less, preferably 10 nm to 50 nm.

Figure 11B:
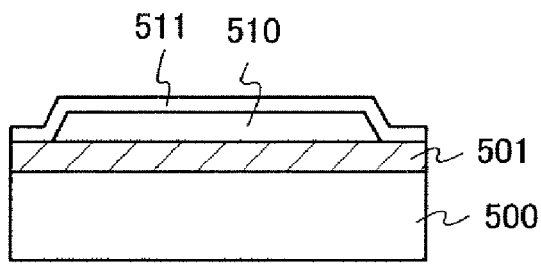

As shown in FIG. 11B, a first insulating film 511 is formed on the crystalline semiconductor film 510. The first insulating film 511 can be formed of an insulating material containing silicon as a main component, such as silicon oxide or silicon oxynitride by CVD, sputtering, or the like. Moreover, a material containing a metal oxide as a main component, such as aluminum oxide, tantalum oxide, or hafnium oxide may be used. The first insulating film 511 preferably has a film thickness of 1 nm to 20 nm, and desirably, from 1 nm to 10 nm.

Figure 11C:
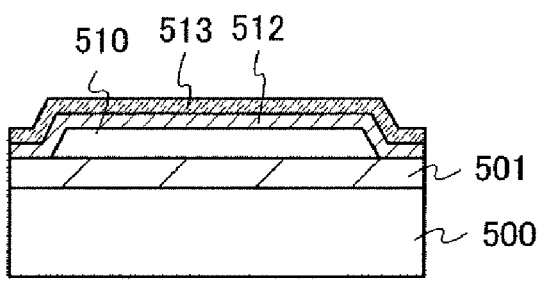

Next, as shown in FIG. 11C, plasma oxidation is performed on the first insulating film 511, thereby forming a second insulating film 512. A charge accumulating film 513 is formed over the second insulating film 512. The second insulating film 512 functions as a tunnel insulating film and the charge accumulating film 513 functions as a floating gate electrode.

The plasma oxidation performed on the first insulating film 511 uses plasma which is excited at a high frequency such as by microwave (typically, 2.45 GHz) and which has an electron density of $1\times10^{11}$ cm$^{-3}$ or more and a plasma electron temperature of 1.5 eV or less. The electron density preferably ranges from $1\times10^{11}$ cm$^3$ to $1\times10^{13}$ cm$^{-3}$, and the plasma electron temperature preferably ranges from 0.5 eV to 1.5 eV. The time of plasma oxidation on the first insulating film 511 is preferably 60 seconds or more.

The plasma oxidation is performed in an atmosphere including at least oxygen ($O_2$); an atmosphere including at least nitrous oxide ($N_2O$) and a noble gas; an atmosphere including at least oxygen, hydrogen ($H_2$), and a noble gas; an atmosphere including at least nitrous oxide, hydrogen, and a noble gas. Note that when the atmosphere includes hydrogen, the ratio of hydrogen is preferably less than that of oxygen, nitrous oxide, or the noble gas.

As the noble gas, typically, Ar or a mixed gas of Ar and Kr may be used. When the plasma oxidation is performed in an atmosphere including a noble gas, the second insulating film 512 may include the noble gas used in the plasma treatment. For example, when Ar is used as the noble gas in the plasma oxidation, the second insulating film 512 may include Ar.

The plasma oxidation is performed under the conditions where the plasma electron density is high at $1\times10^{11}$ cm$^{-3}$ or more and the electron temperature is low in the vicinity of the first insulating film 511, which is an object to be processed; therefore, it is possible to prevent the second insulating film 512 from being damaged due to the plasma. Moreover, since the plasma electron density is high at $1\times10^{11}$ cm$^{-3}$ or more, a film (here, the second insulating film 512) formed by performing plasma oxidation on the object to be processed (here, the first insulating film 511) can be made to be a dense film with a high withstand voltage as compared with a film formed by CVD, sputtering, or the like. Moreover, since the plasma electron temperature is low at 1.5 eV or less, the oxidation treatment can be performed on the object to be processed at a lower temperature than in a conventional plasma treatment or thermal oxidation method. For example, plasma oxidation at 500° C. to 650° C., which is 100° C. or more below the distortion point of the glass substrate can be used to perform oxidation treatment sufficiently.

When an insulating film including hydrogen is subjected to the plasma oxidation, the film can have a reduced hydrogen content.

In this embodiment, the first insulating film 511 is subjected to plasma oxidation in an atmosphere of a mixed gas of oxygen ($O_2$) and argon (Ar). For example, the oxygen may be introduced at 0.1 sccm to 100 sccm and the argon may be introduced at 100 sccm to 5000 sccm into the plasma oxidation atmosphere.

The second insulating film 512 formed by performing the plasma oxidation on the first insulating film 511 functions as a tunnel insulating film in the nonvolatile memory element. Therefore, the thinner the second insulating film 512 is, the more easily tunneling current flows. In addition, when the second insulating film 512 is thinner, the floating gate electrode to be formed later can accumulate charges at a lower voltage.

As a general method for forming a thin insulating film over a semiconductor film, a thermal oxidation method is given. When a substrate whose strain point is 700° C. or less, such as a glass substrate, is used as the substrate 500, it is very difficult to form a tunnel insulating film by thermal oxidizing the semiconductor film. Moreover, an insulating film formed by CVD or sputtering does not have sufficient withstand voltage because defects are included inside the film. Moreover, a thin insulating film formed by CVD or sputtering has problems in that the withstand voltage is low and a defect such as a pinhole easily occurs. Therefore, when the first insulating film 511 formed by CVD or sputtering is used as a tunnel insulating film without any change, a defect easily occurs.

Consequently, when the second insulating film 512 is formed by performing the plasma oxidation on the first insulating film 511 as shown in this embodiment, the second insulating film 512 can be denser and have a higher withstand voltage than an insulating film formed by CVD, sputtering, or the like. Moreover, even when the end portion of the crystalline semiconductor film 510 cannot be covered sufficiently at the time of forming the first insulating film 511, the semiconductor film can be covered sufficiently with the second insulating film 512 by performing the plasma oxidation.

A nonvolatile memory element in this embodiment stores information by injecting electrons through the tunnel insulating film. At this time, when hydrogen causing electron traps exists in the tunnel insulating film, the voltage fluctuates in the course of repeating writing and erasing, which causes the memory to deteriorate. Thus, the hydrogen content of the tunnel insulating film which causes electron traps is preferably low. When the second insulating film 512 is formed by performing the plasma oxidation on the first insulating film 511, the hydrogen content of the film can be made lower than that of an insulating film formed by CVD, sputtering, or the like.

As described above, the crystalline semiconductor film 510, in which a channel formation region is formed, is formed to have a thin thickness of 40 nm or less. Further, the tunnel insulating film is oxidized by oxygen plasma oxidation with high electron density; thus, a power consumption nonvolatile memory element capable of high speed operation can be formed.

The charge accumulating film 513 can be formed as a single layer or a stack of two or more layers. For example, a layer included in the charge accumulating film 513 can be formed of a material selected from a semiconductor material such as silicon (Si) or germanium (Ge); a compound containing silicon as a main component; a metal selected from tungsten (W), titanium (Ti), tantalum (Ta), and molybdenum (Mo), and the like; an alloy material including any of these metals as its main component; or a metal compound material including any of the metals as its main component (such as a metal nitride or a metal oxide of the element).

For example, as compounds including silicon as a main component, there are silicon nitride, silicon nitride oxide, silicon carbide, a silicide (such as tungsten silicide, titanium silicide, or nickel silicide), and the like. As semiconductor materials, there is silicon germanium containing n-type or p-type silicon and germanium at a concentration of 10 atomic percent or less. As metal compounds, there are tantalum nitride, tantalum oxide, tungsten nitride, titanium nitride, titanium oxide, tin oxide, and the like. Further, when silicon is used, an impurity which imparts conductivity, such as phosphorus or boron may be added.

Figure 11D:
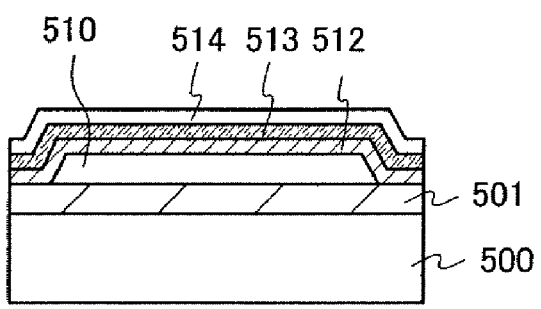

As shown in FIG. 11D, a third insulating film 514 is formed on the charge accumulating film 513. The thickness of the third insulating film 514 is 1 nm to 100 nm, and desirably 20 nm to 60 nm. The third insulating film 514 is formed from an insulating material containing silicon as a main component, such as silicon oxide or silicon oxynitride, or a metal oxide such as aluminum oxide, tantalum oxide, or hafnium oxide. The films are formed by CVD, sputtering, or the like.

Figure 12A:
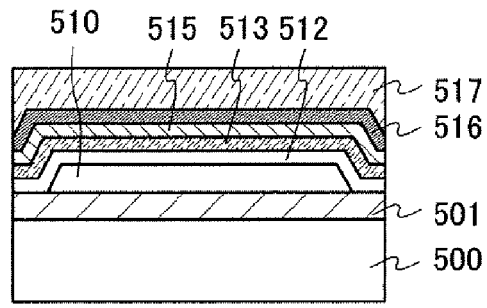
FIGS. 12A to 12D are diagrams for illustrating a method of forming a nonvolatile memory element.

As with the oxidation plasma treatment on the first insulating film 511, plasma oxidation is performed on the third insulating film 514. As shown in FIG. 12A, the third insulating film 514 is subjected to plasma oxidation; thus, a fourth insulating film 515 is formed. Next, a conductive film 516 and a conductive film 517 are sequentially stacked on the fourth insulating film 515.

The conductive films 516 and 517 are conductive films included in a gate electrode (control gate electrode). An example of forming the gate electrode having two layers of conductive films is shown; however, the gate electrode may have one layer, three layers, or more layers of conductive films. A conductive film forming the control gate electrode may be formed from a material selected from n-type or p-type silicon; a metal such as tantalum (Ta), tungsten (W), titanium (Ti), molybdenum (Mo), aluminum (Al), copper (Cu), chromium (Cr), or niobium (Nb), an alloy including any of the metals as its main component; or a metal compound including those metals as its main component (metal nitride, metal oxide, or the like).

Figure 12B:
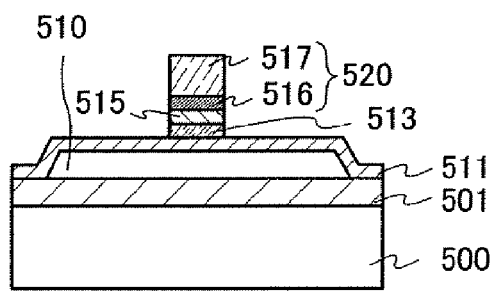

A resist mask is formed by photolithography. The conductive films 516 and 914 are etched using the resist mask, and a gate electrode 520 is formed on the crystalline semiconductor film 510 as shown in FIG. 12B. In addition, the fourth insulating film 515 and the charge accumulating film 513 are etched using the gate electrode 520 as a mask. Consequently, side surfaces of the gate electrode 520, the fourth insulating film 515, and the charge accumulating film 513 approximately align. The charge accumulating film 513 functions as a floating gate electrode, the fourth insulating film 515 functions as a control insulating film, and the gate electrode 520 serves as a control gate electrode.

Figure 12C:
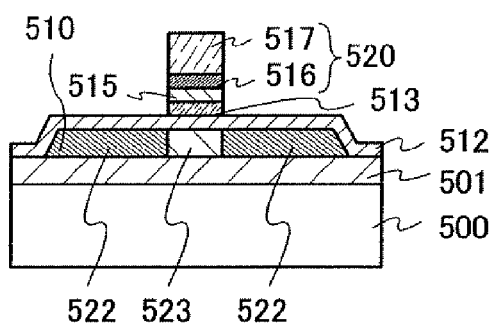

As shown in FIG. 12C, an impurity which imparts an n-type or p-type conductivity is added using the gate electrode 520 as a mask, thereby forming a pair of impurity regions 522 and a channel formation region 523 between the pair of impurity regions 522. As an impurity which imparts n-type conductivity, phosphorus (P), arsenic (As), or the like may be used, and as a p-type impurity, boron (B) or the like can be used. After an impurity imparting n-type or p-type conductivity is added, heat treatment is performed to activate the impurity.

Figure 12D:
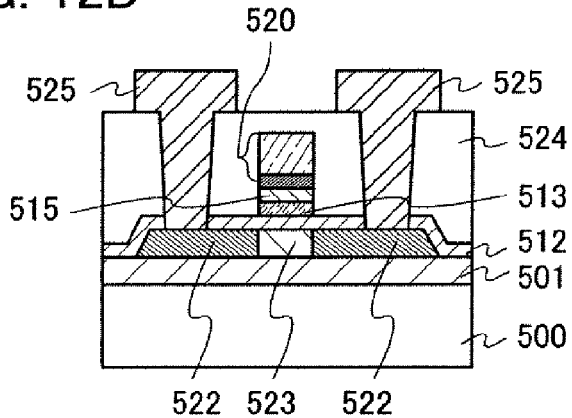

As shown in FIG. 12D, a sixth insulating film 524 is formed so as to cover the gate electrode 520. Openings reaching the impurity regions 522 are formed in the sixth insulating film 524 and the second insulating film 512. Electrodes 525 connected to the impurity regions 522 are formed over the sixth insulating film 524.

Through the above steps, a nonvolatile memory element which is a semiconductor element can be manufactured. Note that the structure of the nonvolatile memory element in this embodiment is one example, and a semiconductor film which is crystallized by a method of the present invention may be naturally applied to a nonvolatile memory element having another structure.

Embodiment 2

In this embodiment, a method of manufacturing a semiconductor device using a semiconductor film crystallized by a method of the present invention will be described. The structure and manufacturing method of a semiconductor device will be described taking a semiconductor device which wirelessly inputs and outputs data, as an example.

In recent years, a wireless chip has received a lot of attention as a compact semiconductor device that is a combination of an ultra compact IC chip and an antenna for wireless communication. The wireless chip can write or read data by transferring and receiving a communication signal (operation magnetic field) using a wireless communication device (hereinafter referred to as a reader/writer).

As an application field of the wireless chip, merchandise management in the distribution industry is given as an example. Nowadays, although merchandise management utilizing a barcode is a mainstream, since barcode is read optically, data cannot be read when there is an interrupting object. Meanwhile, since the wireless chip reads data wirelessly, the data can be read even if there is an interruption object. Consequently, an improvement in efficiency and reduction in cost of merchandise management can be realized. In addition, the wireless chip can be widely applied to, for example, train tickets, airplane tickets, and automatic resets.

As the range of application of wireless chips expands, wireless chips having further advanced functions are increasingly in demand. For example, data can be prevented from being leaked to a third party by encrypting transmitted/received data. For this purpose, there are methods of performing coding/decoding processing using hardware, using software, and using both hardware and software. In the method of processing using hardware, an arithmetic circuit is a circuit dedicated for coding and decoding. In the method of processing using software, an arithmetic circuit includes a CPU (Central Processing Unit) and a large scale memory, and the CPU executes a coding program and a decoding program. In the method of processing using both hardware and software, an arithmetic circuit includes a coding/decoding dedicated circuit, a CPU, and a memory; the dedicated circuit performs part of arithmetic processing for coding/decoding, and the CPU executes programs other than arithmetic processing. However, in any case, a wireless chip is to be provided with a high-capacity memory. By applying the present invention, rise in power consumption can be avoided even if the capacity of the memory is increased.

Figure 13:
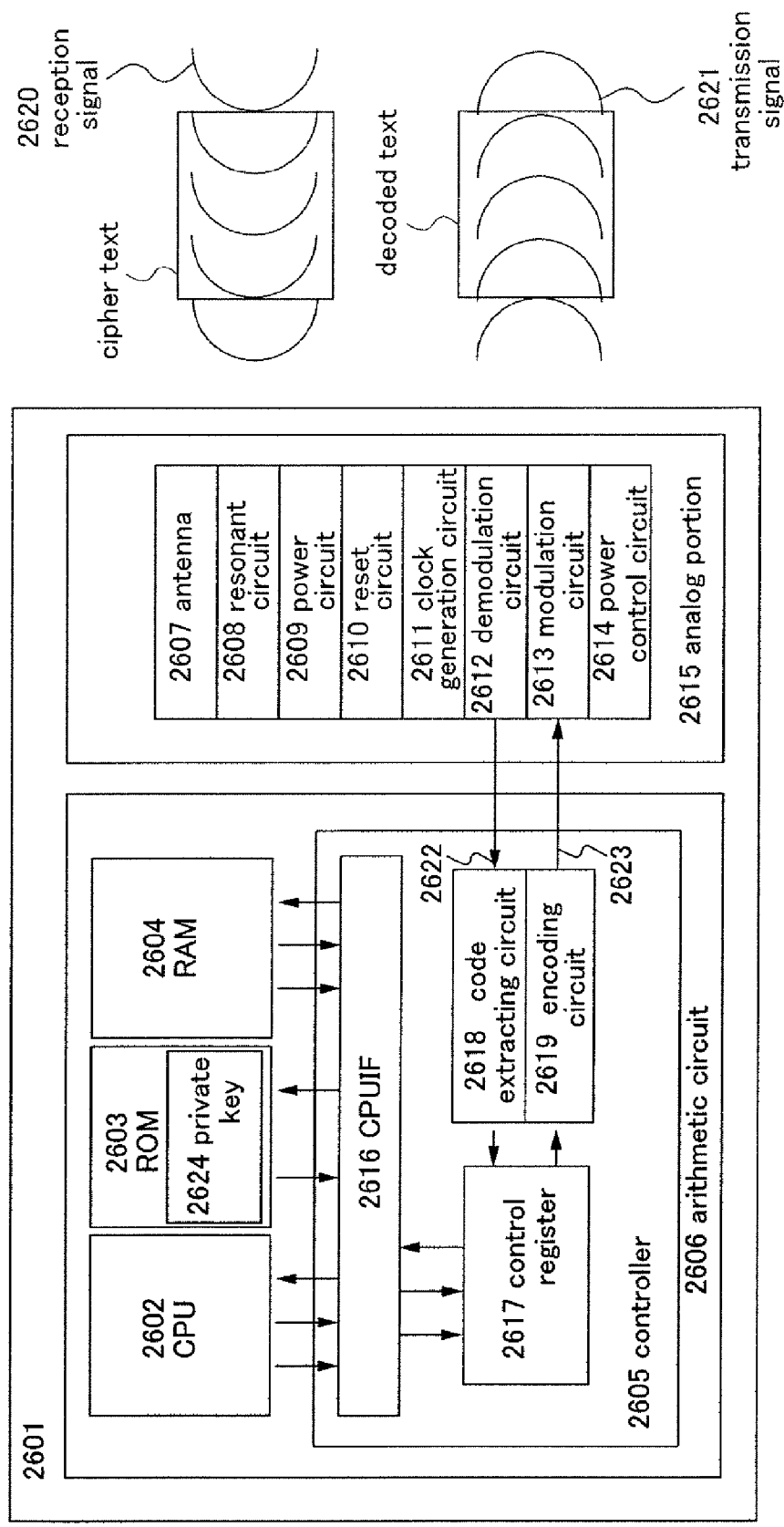
FIG. 13 is a block diagram of a semiconductor device having a function of wireless communication.

In this embodiment, as an example of a semiconductor device having a dedicated circuit and a memory circuit according to the present invention, a wireless chip having a cipher processing function will be described. FIG. 13 is an example of a block diagram of a semiconductor device.

A semiconductor device 2601 includes an arithmetic circuit 2606 and an analog portion 2615. The arithmetic circuit 2606 includes a CPU 2602, a ROM 2603, a RAM 2604, and a controller 2605. The analog portion 2615 includes an antenna 2607, a resonant circuit 2608, a power circuit 2609, a reset circuit 2610, a clock generation circuit 2611, a demodulation circuit 2612, a modulation circuit 2613, and a power control circuit 2614.

The ROM 2603 can be formed from a memory circuit having a nonvolatile memory element of Embodiment 1 in its memory cell, and a mask ROM using a thin film transistor. Further, a DRAM or SRAM using a thin film transistor can be applied the RAM 2604. Using the present invention, power consumption of the ROM 2603 and the RAM 2604 can be reduced. Further, power consumption is reduced, heat generated by the semiconductor device 2601 can be reduced.

The controller 2605 includes a CPU interface (CPUIF) 2616, a control register 2617, a code extracting circuit 2618, and an encoding circuit 2619. Note that although in FIG. 13, a communication signal is shown separated into a reception signal 2620 and a transmission signal 2621 for simplification of the description, they actually overlap each other and are transmitted and received simultaneously between the semiconductor device 2601 and a reader/writer. The reception signal 2620 is demodulated by the demodulation circuit 2612 after they are received by the antenna 2607 and the resonance circuit 2608. Further, the transmission signal 2621 is transmitted from the antenna 2607 after it is modulated by the modulation circuit 2613.

In FIG. 13, when the semiconductor device 2601 is placed inside the magnetic field generated by a communication signal, induced electromotive force is produced by the antenna 2607 and the resonance circuit 2608. The induced electromotive force is held by a capacitor in the power source circuit 2609, further, the potential is stabilized, and the induced electromotive force is supplied as power source voltage to each circuit of the semiconductor device 2601. The reset circuit 2610 generates an original reset signal for the whole semiconductor device 2601. For example, the reset circuit generates a signal which rises after rise in the power source voltage with delay as a reset signal. The clock generating circuit 2611 changes the frequency of a clock signal and the duty ratio in response to a control signal generated by the power source managing circuit 2614. The demodulation circuit 2612 detects amplitude variation of the received signal 2620 of an ASK system as received data 2622 of "0"/"1". The demodulation circuit 2612 is, for example, a low-pass filter. Further, the modulation circuit 2613 transmits transmitted data by varying amplitude of the transmitted signal 2621 of an ASK system. For example, in a case where a transmitted data 2623 is "0", the resonance point of the resonance circuit 2608 is changed, thereby changing amplitude of the communication signal. The power source managing circuit 2614 monitors the power source voltage supplied from the power source circuit 2609 to the arithmetic circuit 2606 or current consumption in the arithmetic circuit 2606, thereby generating a control signal for changing frequency of the clock signal and the duty ratio in the clock generating circuit 2611.

An operation of a semiconductor device 2601 in FIG. 13 will be described. First, a received signal 2620 including cipher text data is received by the semiconductor device 2601 from the received signal 2620 transmitted from the reader/writer. After the received signal 2620 is demodulated by the demodulation circuit 2612, the received signal 2620 is separated into a control command, cipher text data, and the like by a code extracting circuit 2618, and then it is stored in the control register 2617. Here, the control command is a data for designating response of the semiconductor device 2601. For example, transmission of a unique ID number, operation stop, decoding, and the like are designated. Here, assume that a control command for decoding is received.

Subsequently, in the arithmetic circuit 2606, a CPU 2602 decodes a cipher text using a private key 2624 stored in a ROM 2603 in advance in accordance with a decoding program stored in the ROM 2603. The decoded cipher text (decoded text 2623) is stored in the control register 2617. At that time, the RAM 2604 is used as a data storing region. Note that the CPU 2602 accesses the ROM 2603, the RAM 2604, and the control register 2617 via the CPUIF 2616. The CPUIF 2616 has a function of generating an access signal with respect to any one of the ROM 2603, the RAM 2604, and the control register 2617 in accordance with the address which the CPU 2602 demands.

Filially, in the encoding circuit 2619, the transmitted data 2623 is generated from the decoded text and modulated by the modulation circuit 2613, and the transmitted signal 2621 is transmitted to the reader/writer from the antenna 2607.

Note that in the semiconductor device 2601 of FIG. 13, a method using software has been described as an arithmetic method; however, an arithmetic method may be selected in accordance with the purpose to form a semiconductor device. Note that in the method using software, an arithmetic circuit is formed from a CPU and a large scale memory, and a program is executed by the CPU. As another arithmetic method, there are a method using hardware and a method using both hardware and software. In the method of processing using hardware, an arithmetic circuit may be a dedicated circuit. In the method of processing using both hardware and software, an arithmetic circuit may include a dedicated circuit, a CPU, and a memory; the dedicated circuit performs a part of arithmetic processing, and the CPU executes programs other than arithmetic processing.

Next, a method of manufacturing the semiconductor device 2601 will be described. In this embodiment, a manufacturing method of a semiconductor device will be described. In this embodiment, a method of manufacturing a flexible semiconductor device will be shown, in which a circuit included in a semiconductor device is formed of a thin film transistor or a nonvolatile memory element, and the circuit is transferred to a flexible substrate from a substrate used in manufacturing the thin film transistor.

As a semiconductor element included in the semiconductor device 2601, a p-channel TFT 326 (also referred to as Pch-TFT) included in an inverter or the like, an n-channel TFT 327 (also referred to as Nch-TFT), a capacitor 328, and an n-channel TFT of a high withstand voltage type 329 used for a power source circuit or the like are representatively shown to describe a method of manufacturing the semiconductor device 2601. Hereinafter, a manufacturing method of a wireless chip is described with reference to FIGS. 14A to 19.

Figure 14A:
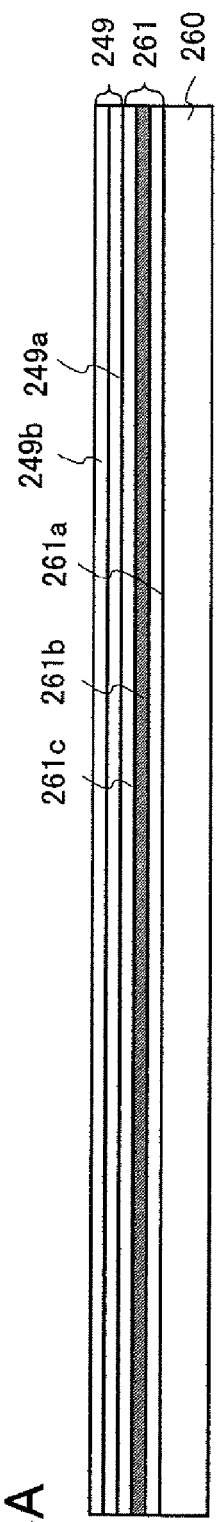
FIGS. 14A to 14D are diagrams for illustrating a method of manufacturing a semiconductor device having a function of wireless communication.

A glass substrate is used as a substrate 260. As shown in FIG. 14A, a peeling layer 261 including three layers 261a to 261c is formed over the substrate 260. The first layer 261a is formed of a silicon oxynitride film ($SiO_xN_y$, x>y>0) with a thickness of 100 nm by a parallel plate type plasma CVD apparatus using $SiH_4$ and $N_2O$ as a source gas. The second layer 261b is formed of a tungsten film with a thickness of 30 nm using a sputtering apparatus. The third layer 261c is formed of a silicon oxide film with a thickness of 200 nm using a sputtering apparatus.

By the formation of the third layer 261c (silicon oxide), a surface of the second layer 261b (tungsten) is oxidized to form tungsten oxide at the interface. By the formation of the tungsten oxide, the substrate 260 can be easily separated when a semiconductor element is transferred to another substrate later. The first layer 261a is a layer for keeping close contact with the second layer 261b during the manufacturing of the semiconductor element.

The second layer 261b is preferably formed of a metal film including tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or a film including a compound of such metal. The second layer 261b has a thickness of 20 nm to 40 nm.

Figure 14B:
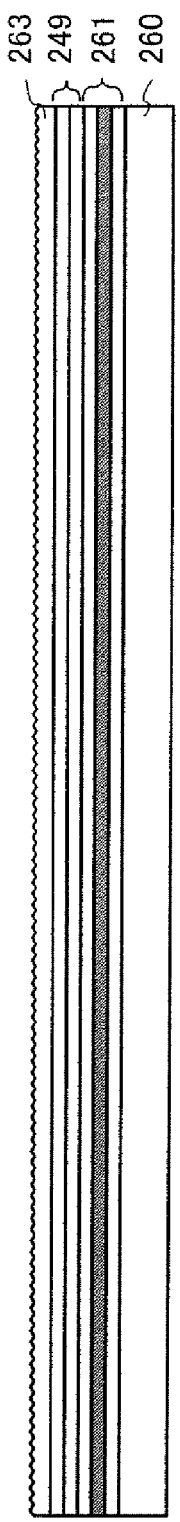

As shown in FIG. 14B, a base insulating layer 249 having a two-layer structure is formed over the peeling layer 261. A first layer 249a is formed of silicon nitride oxide ($SiO_xN_y$, 0<x<y) with a thickness of 50 nm by a plasma CVD apparatus using $SiH_4$, $N_2O$, $NH_3$, and $H_2$ as a source gas. The barrier property is increased by setting the composition ratio of nitrogen of the first layer 249a to be 40% or more. The second layer 249b is formed of silicon oxynitride ($SiO_xN_y$, x>y>0) with a thickness of 100 nm by a plasma CVD apparatus using $SiH_4$ and $N_2O$ as a source gas. The composition ratio of nitrogen of the second layer 249b is set at 0.5% or less.

In this embodiment, a crystalline silicon film is formed by a crystallization method shown in Embodiment Mode 1. Alternatively, any one of methods shown in other Embodiment Modes 2 to 4 may be used. An amorphous silicon film is formed on the base insulating layer 249 by a plasma CVD apparatus using a source gas of $SiH_4$ and $H_2$. A surface of the amorphous silicon film is processed by etching to form an amorphous silicon film 263 having a projection with a triangular cross section on its surface.

Figure 14C:
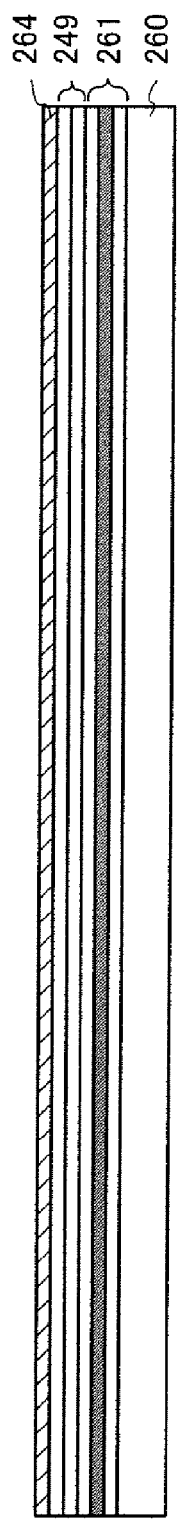
Figure 14D:
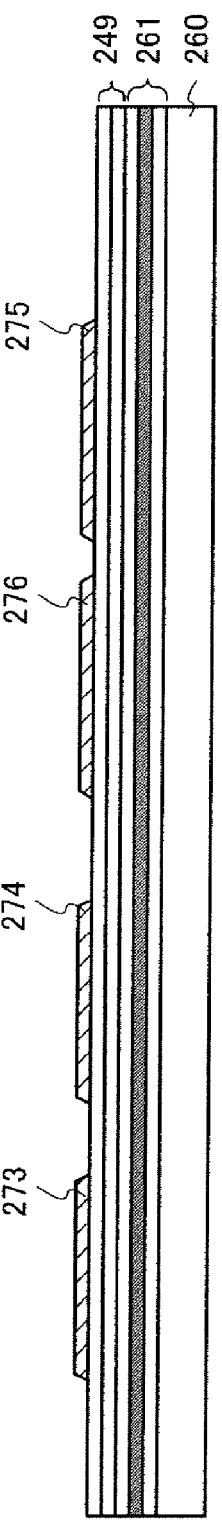

A second harmonic of a $YVO_4$ laser is applied to totally melt the amorphous silicon film 263, and a crystalline silicon film 264 is formed as shown in FIG. 14C. The crystalline silicon film 264 is processed by photolithography and etching as shown in FIG. 14D, thereby forming island-shaped crystalline semiconductor films 273 to 276. In the island-shaped crystalline semiconductor films 273 to 275, a channel formation region, a source region, and a drain region of each TFT are formed. The island-shaped crystalline semiconductor film 276 forms an electrode of a MIS capacitor.

As shown in FIG. 15A, a resist R31 is formed by a photolithography process and a minute amount of p-type impurities are added to the crystalline semiconductor films 274 and 275 of the n-channel TFTs. Here, diborane ($B_2H_6$) diluted with hydrogen is used as a doping gas so that the crystalline semiconductor films 274 and 275 are doped with boron by an ion doping apparatus. The resist R31 is removed after completion of the doping.

The step in FIG. 15A is performed for a purpose of avoiding the threshold voltage of the n-channel TFT becoming negative. Boron may be added to the crystalline semiconductor films 274 and 275 of the n-channel TFTs at a concentration of $5\times10^{15}$ atoms/cm$^3$ to $1\times10^{17}$ atoms/cm$^3$. The step in FIG. 15A is performed as necessary.

Next, as shown in FIG. 15B, an insulating film 277 is formed over the entire surface of the substrate 260. The insulating film 277 functions as a gate insulating film for the TFTs and a dielectric for the capacitor. Here, the insulating film 277 is formed by a silicon oxynitride film ($SiO_xN_y$, x>y>0) with a thickness of 20 nm to 40 nm by a plasma CVD apparatus using $SiH_4$ and $N_2O$ as a source gas.

As shown in FIG. 15C, a resist R32 is formed by a photolithography process, and an n-type impurity is added to the crystalline semiconductor film 276 of the capacitor. Using phosphine ($PH_3$) diluted with hydrogen as a doping gas, the crystalline semiconductor film 276 is doped with phosphorus by using an ion doping apparatus, and an n-type impurity region 279 is formed over the entire crystalline semiconductor film 276. The resist R32 is removed after completion of the doping step.

As shown in FIG. 15D, a conductive film 281 is formed over the insulating film 277. The conductive film 281 forms a gate electrode of the TFT, and the like. Here, the conductive film 281 has a two-layer structure. A first layer thereof is formed of tantalum nitride with a thickness of 30 nm and a second layer thereof is formed of tungsten (W) with a thickness of 370 nm. The tantalum nitride and the tungsten are formed by a sputtering apparatus.

A resist is formed over the conductive film 281 by a photolithography process, and the conductive film 281 is etched by an etching apparatus. Thus, first conductive films 283 to 286 are formed over the crystalline semiconductor films 273 to 276 as shown in FIG. 16A. The first conductive films 283 to 285 serve as gate electrodes or gate wires of the TFTs. In the n-channel TFT of a high withstand voltage type, the conductive film 285 is formed so that the gate width (channel length) is larger than that in the other TFTs. The first conductive film 286 forms one electrode of the capacitor.

The conductive film 281 is etched by a dry etching method. As an etching apparatus, an ICP (Inductively Coupled Plasma) etching apparatus is used. As an etchant, a mixed gas of $Cl_2$, $SF_6$, and $O_2$ is used first in order to etch the tungsten, and then the etchant to be introduced in a process chamber is changed to only a $Cl_2$ gas to etch the tantalum nitride.

As shown in FIG. 16B, a resist R33 is formed by a photolithography process. An n-type impurity is added to the crystalline semiconductor films 274 and 275 of the n-channel TFT. N-type low-concentration impurity regions 288 and 289 are formed in a self-aligned manner in the crystalline semiconductor film 274 by using the first conductive film 284 as a mask. Further, n-type low-concentration impurity regions 290 and 291 are formed in a self-aligned manner in the crystalline semiconductor film 275 by using the first conductive film 285 as a mask. Phosphine ($PH_3$) diluted with hydrogen is used as a doping gas, and phosphorus is added to the crystalline semiconductor films 274 and 275 by an ion doping apparatus. The step of FIG. 16B is a step for forming an LDD region in the n-channel TFT. The n-type impurity is included in the n-type low-concentration impurity regions 288 and 289 at a concentration of $1\times10^{16}$ atoms/cm$^3$ to $5\times10^{18}$ atoms/cm$^3$.

As shown in FIG. 16C, a resist R34 is formed by a photolithography process, and a p-type impurity is added to the crystalline semiconductor film 273 of the p-channel TFT. Since a part of the crystalline semiconductor film 272, which remains as an n-type impurity region is covered with the resist R34, the exposed area becomes a p-type impurity region. P-type high-concentration impurity regions 273a and 273b are formed in a self-aligned manner in the crystalline semiconductor film 273 by using the first conductive film 283 as a mask. A region 273c covered with the first conductive film 283 is formed in a self-aligned manner as the channel formation region. Doping of the p-type impurity region uses diborane ($B_2H_6$) diluted with hydrogen as a doping gas. The resist R34 is removed after completion of the doping.

As shown in FIG. 16D, insulating layers 293 to 296 are formed on the side surfaces of the first conductive films 283 to 286. The insulating layers 293 to 296 are called sidewalls or side walls. First, a silicon oxynitride film ($SiO_xN_y$, x>y>0) is to have a thickness of 100 nm by a plasma CVD apparatus using $SiH_4$ and $N_2O$ as a source gas. Subsequently, a silicon oxide film is formed to have a thickness of 200 nm by an LPCVD apparatus using $SiH_4$ and $N_2O$ as a source gas. A resist is formed by a photolithography process. First, using this resist, the silicon oxide film of an upper layer is subjected to a wet etching treatment with buffered hydrochloric acid. Next, the resist is removed, and by subjecting the silicon nitride oxide film of a lower layer to a dry etching treatment, the insulating layers 293 to 296 are formed. In accordance with a sequence of these steps, the insulating film 277 formed of silicon oxynitride is also etched and the insulating film 277 is left only under the first conductive films 283 to 285 and the insulating layers 293 to 296.

As shown in FIG. 17A, a resist R35 is formed by a photolithography process. An n-type impurity is added to the crystalline semiconductor films 274 and 275 of the n-channel TFTs and the semiconductor layer of the capacitor, thereby forming n-type high-concentration impurity regions. In the crystalline semiconductor film 274, the n-type impurity is further added to the n-type low-concentration impurity regions 288 and 289 by using the first conductive film 284 and the insulating layer 294 as masks. Consequently, n-type high-concentration impurity regions 274a and 274b are formed in a self-aligned manner. A region 274c overlapping with the first conductive film 284 is determined as a channel formation region in a self-aligned manner. In addition, regions 274e and 274d of the n-type low-concentration impurity regions 288 and 289 that overlap with the insulating layer 294 are settled as n-type low-concentration impurity regions. Similarly to the crystalline semiconductor film 274, n-type high-concentration impurity regions 275a and 275b, a channel formation region 275c, and n-type low-concentration impurity regions 275e and 275d are formed in the crystalline semiconductor film 275. Further, an n-type impurity is further added to the n-type impurity region 279 by using the first conductive film 286 and the insulating layer 296 as masks, thereby forming n-type high-concentration impurity regions 276a and 276b in a self-aligned manner. A region of the crystalline semiconductor film 276 that overlaps with the first conductive film 286 and the insulating layer 296 is determined as an n-type impurity region 276c.

In the step of adding the n-type impurity, as aforementioned, an ion doping apparatus may be used and phosphine ($PH_3$) diluted with hydrogen is used as a doping gas. The n-type high-concentration impurity regions 274a, 274b, 275a, and 275b of the n-channel TFTs are doped with phosphorus such that the concentration of phosphorus ranges from $1\times10^{20}$ atoms/cm$^3$ to $2\times10^{21}$ atoms/cm$^3$.

The resist R35 is removed to form a cap insulating film 298 as shown in FIG. 17B. The cap insulating film 298 is formed with a silicon oxynitride film ($SiO_xN_y$, x>y>0) to have a thickness of 50 nm by a plasma CVD apparatus. $SiH_4$ and $N_2O$ are used as a source gas to form the silicon oxynitride film. After forming the cap insulating film 298, heat treatment is performed in a nitrogenous atmosphere of 550° C. to activate the n-type impurity and the p-type impurity added in the crystalline semiconductor films 273 to 276.

As shown in FIG. 17C, a first interlayer insulating film 300 is formed. The first interlayer insulating film 300 has a two-layer structure. An insulating film of a first layer is formed of silicon nitride oxide ($SiO_xN_y$, 0<x<y) with a thickness of 100 nm by a plasma CVD apparatus using $SiH_4$ and $N_2O$ as a source gas. An insulating film of a second layer is formed of silicon oxynitride ($SiO_xN_y$, x>y>0) with a thickness of 600 nm by using $SiH_4$, $N_2O$, $NH_3$, and $H_2$ as a source gas by a plasma CVD apparatus.

Part of the first interlayer insulating film 300 and the cap insulating film 298 are removed by a photolithography process and a dry etching step, thereby forming contact holes. A conductive film is formed over the first interlayer insulating film 300. Here, the conductive film is formed to have a four-layer structure in which Ti, titanium nitride, pure aluminum, and titanium nitride with a thickness of 60 nm, 40 nm, 500 nm, and 100 nm, respectively, are stacked in order from the bottom. These layers are formed by a sputtering apparatus.

The conductive film is processed into a predetermined shape by a photolithography process and a dry etching step, thereby forming second conductive films 303 to 314.

Although the second conductive film 313 and the first conductive film 286 are connected to each other over the semiconductor layer in the drawing in order to explain the connection between the second conductive film 313 and the first conductive film 286, in practice, the contact portion between the second conductive film 313 and the first conductive film 286 is formed so as to avoid the upside of the semiconductor layer.

The n-type high-concentration impurity regions 276a and 276b are connected to each other by the second conductive film 312. Accordingly, an MIS capacitor of a stacked-layer structure including the n-type impurity region 276c, the insulating film 277, and the first conductive film 286 is formed. The second conductive film 314 forms a terminal of an antenna circuit, to which an antenna 322 is connected.

As shown in FIG. 18A, a second interlayer insulating film 316 is formed. In the second interlayer insulating film 316, a contact hole reaching the second conductive films 314 is formed. An example of forming the second interlayer insulating film 316 using photosensitive polyimide is shown. Polyimide is applied to have a thickness of 1.5 μm by using a spinner. The polyimide is light-exposed by a photolithography process and developed, thereby forming polyimide having the contact holes therein. After the development, the polyimide is baked.

Further, a conductive film is formed over the second interlayer insulating film 316. This conductive film is processed into a predetermined shape by a photolithography process and an etching step, thereby forming a third conductive film 320. The conductive film that forms the third conductive film 320 is formed of Ti to have a thickness of 100 nm by a sputtering apparatus. The third conductive film 320 serves as a bump of the antenna for connecting the antenna 322 with the terminal (second conductive film 314) of the antenna circuit.

As shown in FIG. 18B, a third interlayer insulating film 321 having an open portion is formed. Here, the third interlayer insulating film 321 is formed of photosensitive polyimide by a similar method to the method for forming the second interlayer insulating film 316. The open portion is formed in a region where the antenna 322 is formed.

As shown in FIG. 18B, the antenna 322 is formed. The antenna 322 with a predetermined shape is formed in the open portion by evaporating aluminum using a metal mask with the use of an evaporation apparatus.

Figure 19:
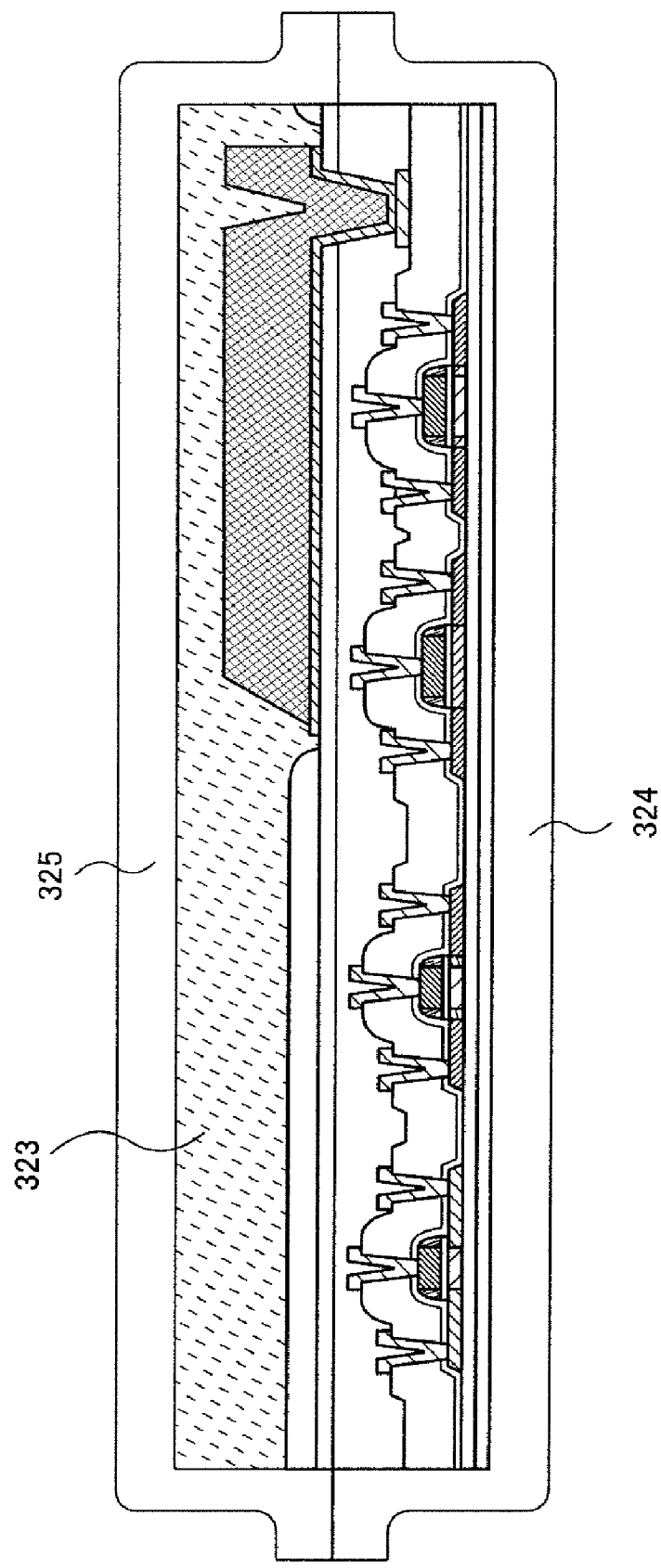
FIG. 19 is a diagram for illustrating a method of manufacturing a semiconductor device having a function of wireless communication.
Figure 20A:
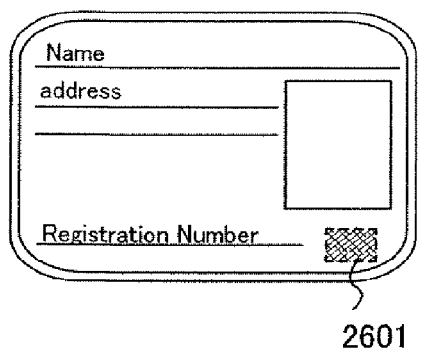
FIGS. 20A to 20F are diagrams for illustrating usage of semiconductor devices having a function of wireless communication.
Figure 20B:
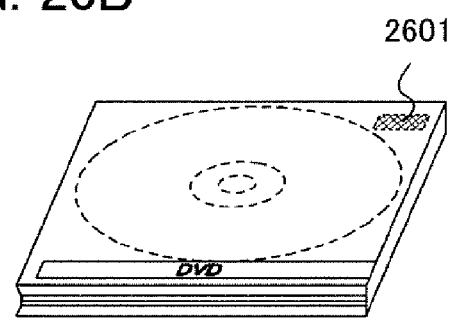
Figure 20C:
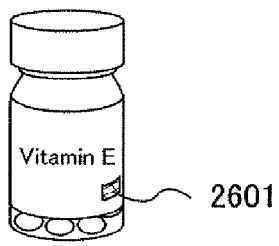
Figure 20D:
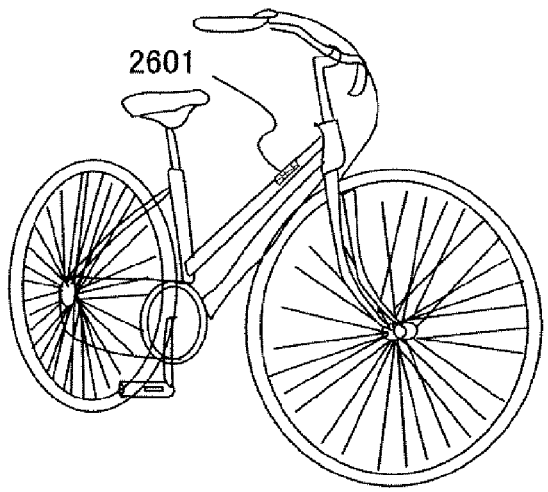
Figure 20E:
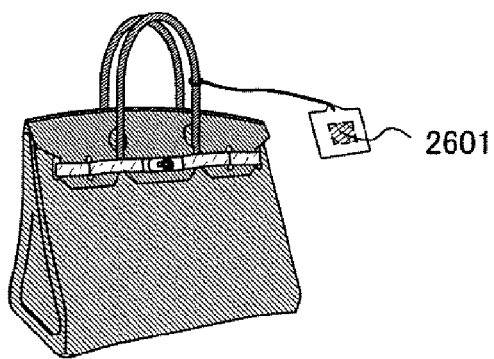
Figure 20F:
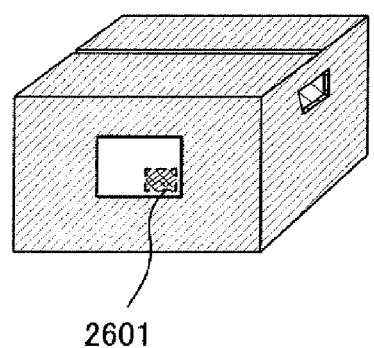

Through the steps shown in FIGS. 15A to 18B, a semiconductor device having wireless communication function is formed over the substrate 260. Next, a step in which the semiconductor device is sealed in between the substrate 260 and a flexible substrate as shown in FIG. 19 will be described.

A protective insulating layer 323 for protecting the antenna 322 is formed. The insulating films stacked over the substrate 260 is removed together with the protective insulating layer 323 by a photolithography process and an etching step or by laser irradiation, thereby forming open portions that reach the peeling layer 261. A plurality of integrated circuits forming a semiconductor device is formed over the substrate 260. Since all integrated circuits over the substrate 260 are collectively separated from the substrate 260, an opening is formed to surround all the integrated circuits.

Subsequently, after temporarily fixing the substrate for transfer onto the protective insulating layer 323, the substrate 260 is peeled off. Since the bond of the second layer 261b and the third layer 261c of the peeling layer 261 at the interface therebetween is weak, the peeling progresses from the end of the open portion by applying physical force, thereby peeling the substrate 260 from the semiconductor element. The base insulating layer 249 from which the substrate 260 has been peeled is fixed to the flexible substrate 324 with an adhesive. Then, the substrate for the transfer is detached. Since the plurality of integrated circuits is fixed to the flexible substrate 324, the flexible substrate 324 is divided for each integrated circuit. Another flexible substrate 325 is fixed to the protective insulating layer 323 with the adhesive. Then, by performing heat treatment while applying pressure from the outside of the flexible substrates 324 and 325, the integrated circuits and antenna are sealed by the flexible substrate 324 and the flexible substrate 325.

Although an example of forming the antenna 322 with a semiconductor element is described in this embodiment, an external antenna can also be used. Further, although an example of peeling the substrate 260 used during manufacturing is described in this embodiment, the substrate used during manufacturing can be left. In this case, the substrate may be thinned by polishing or grinding so that substrate bends.

Embodiment 3

Use of a semiconductor device capable of wireless communication will be described with reference to FIGS. 20A to 20F.

A semiconductor device capable of wireless communication can be applied to a wide range of purposes. For example, the wireless chip can be attached to bank notes, coins, documents of value, bearer bonds, identification certificates (such as a driver's license or a residence card, see FIG. 20A), pack cases (such as package paper or a bottle, refer to FIG. 20C), recording media (such as DVD software or a video tape, see FIG. 20B), vehicles (such as a bicycle, see FIG. 20D), personal belongings (such as a bag or glasses), foods, plants, animals, human bodies, clothes, general merchandise, products such as electronic appliances, luggage tags (see FIGS. 20E and 20F), and the like.

The semiconductor device 2601 is fixed to a product by mounting the device onto a printed board, attaching the device to a surface of the product, or embedding the device inside the product. For example, if the product is a book, the device is fixed to the book by embedding the device inside paper, and if the product is a package made of an organic resin, the device is fixed to the package by embedding the device inside the organic resin. Since the semiconductor device 2601 can be compact, thin, and lightweight, it does not degrade the quality of design even after the device is fixed to a product. When the semiconductor device 2601 is provided to bank notes, coins, documents of value, bearer bonds, identification certificates, and the like, an authentication function can be provided. With the use of this authentication function, the forgery can be prevented. Further, when the semiconductor device of the present invention is attached to pack cases, recording media, personal belongings, foods, clothes, general merchandise, electronic appliances, and the like, systems such as an inspection system can be made efficient.

Embodiment 4

A structural example of an active matrix liquid crystal module as a semiconductor device of the present invention will be explained with reference to FIGS. 21A and 21B. FIG. 21A is a front view of a liquid crystal module, and FIG. 21B is a cross-sectional diagram cut along a line A-A' of FIG. 21A.

Reference numeral 1200 denotes a first substrate; 1201 shown by a dotted line denotes a driver circuit area (source driver); 1202 denotes a pixel portion; and 1203 denotes a driver circuit area (gate driver). Over the first substrate 1200, the pixel portion 1202 formed of a thin film transistor or the like, the source driver 1201, and the gate driver 1203 are formed. A crystalline semiconductor film is used for the thin film transistor; thus, a high performance liquid crystal module which can drive with low power consumption.

Next, a cross-sectional structure of the liquid crystal module will be explained with reference to FIG. 21B. A semiconductor element is formed over a base film 1209 formed of an insulating film. The source driver 1201 includes a CMOS circuit formed in a combination of an n-channel thin film transistor 1211 and a p-channel thin film transistor 1212. The pixel portion 1202 includes a switching thin film transistor 1213 and a capacitor 1214. The switching thin film transistor 1213 is covered with an interlayer insulating film 1221. A pixel electrode 1222 is formed over the interlayer insulating film 1221. The pixel electrode 1222 is electrically connected to the switching thin film transistor 1213.

A protective film 1223 is formed so as to cover a wiring of the switching thin film transistor 1213, the pixel electrode 1222, wirings of the n-channel thin film transistor 1211 and the p-channel thin film transistor 1212. By the protective film 1223, an impurity can be prevented from entering an active layer, the interlayer insulating film 1221, and the like of the thin film transistor. An orientation film 1224 is formed over the protective film 1223. The orientation film 1224 is formed according to need.

A wiring 1210 is a wiring for transmitting a signal or the like to be inputted to the source driver 1201 and the gate driver 1203, and is connected to an FPC (Flexible Printed Circuit) 1208 which serves as an external input terminal. The liquid crystal module includes both of a mode in which only the FPC 1208 is provided and a mode in which both the FPC 1208 and a PWB are provided.

The liquid crystal module includes the substrate for the liquid crystal module including the first substrate 1200 and the semiconductor element, the counter substrate using a second substrate 1230 as a base, a sealant 1205, a liquid crystal 1240, and the FPC (Flexible Printed Circuit) 1208. The liquid crystal module of this embodiment can be bent.

The counter substrate is provided with a color filter 1231, black matrixes (BMs) 1232, a counter electrode 1233, and an orientation film 1234 are formed on the second substrate 1230. The color filter 1231 can be provided on a first substrate 1200 side as well. In addition, the counter electrode 1233 is provided on the pixel portion 1202, so that a liquid crystal module of an IPS system can be formed.

The second substrate 1230 is fixed to the first substrate 1200 with the sealant 1205, facing the first substrate 1200, and the liquid crystal 1240 is injected between the first substrate 1200 and the second substrate 1230 to be sealed with the sealant 1205.

The example in which the driver circuits 1201 and 1203 are formed with the pixel portion 1202 over the first substrate 1200 is shown as in FIGS. 21A and 21B. Alternatively, only the pixel portion 1202 may be formed using a crystalline silicon film of the present invention over the first substrate 1200, the driver circuits 1201 and 1203 may be formed from IC chips using a silicon wafer, and the driver circuits may be electrically connected to the pixel portion 1202 on the first substrate by COG or TAB.

Embodiment 5

Figure 22A:
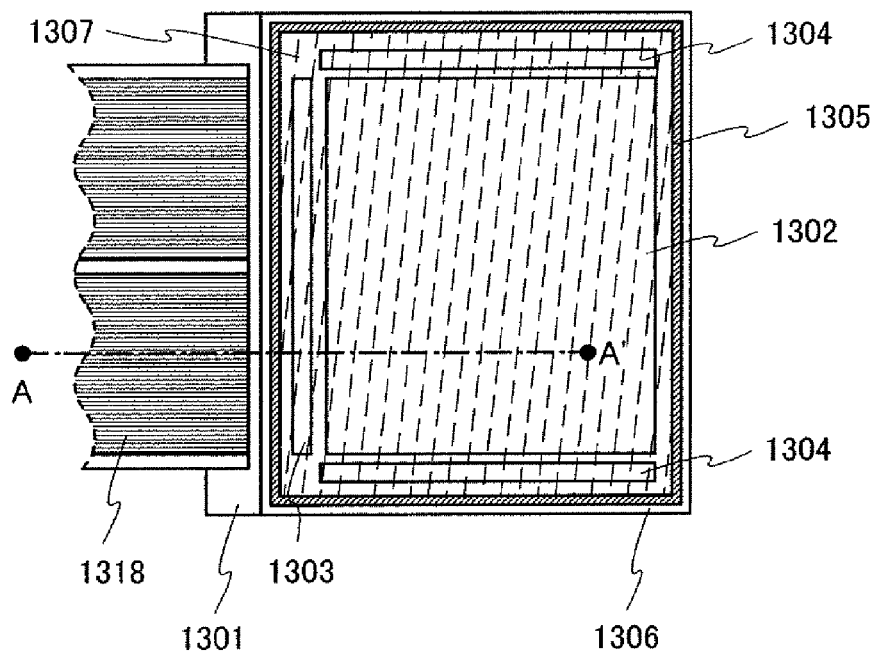
FIGS. 22A and 22B are a front view of a structure example of an EL module and a cross-sectional view thereof, respectively.

A structure example of an active matrix EL (electroluminescent) module will be described as a semiconductor device of the present invention with reference to FIGS. 22A and 22B. FIG. 22A is a front view of an EL module, and FIG. 22B is a cross-sectional view taken along line A-A' of FIG. 22A.

Figure 22B:
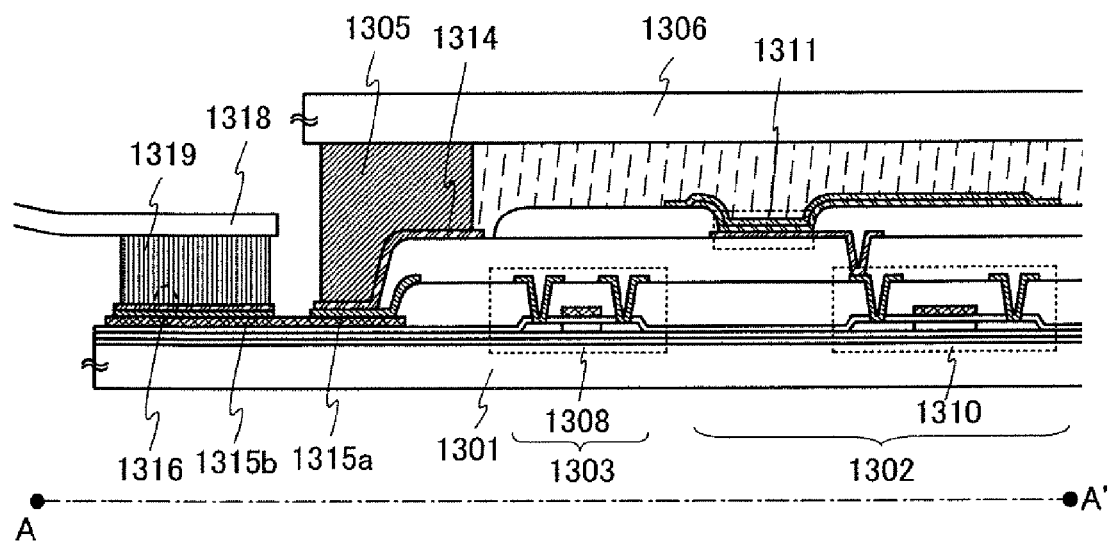
Figure 24:
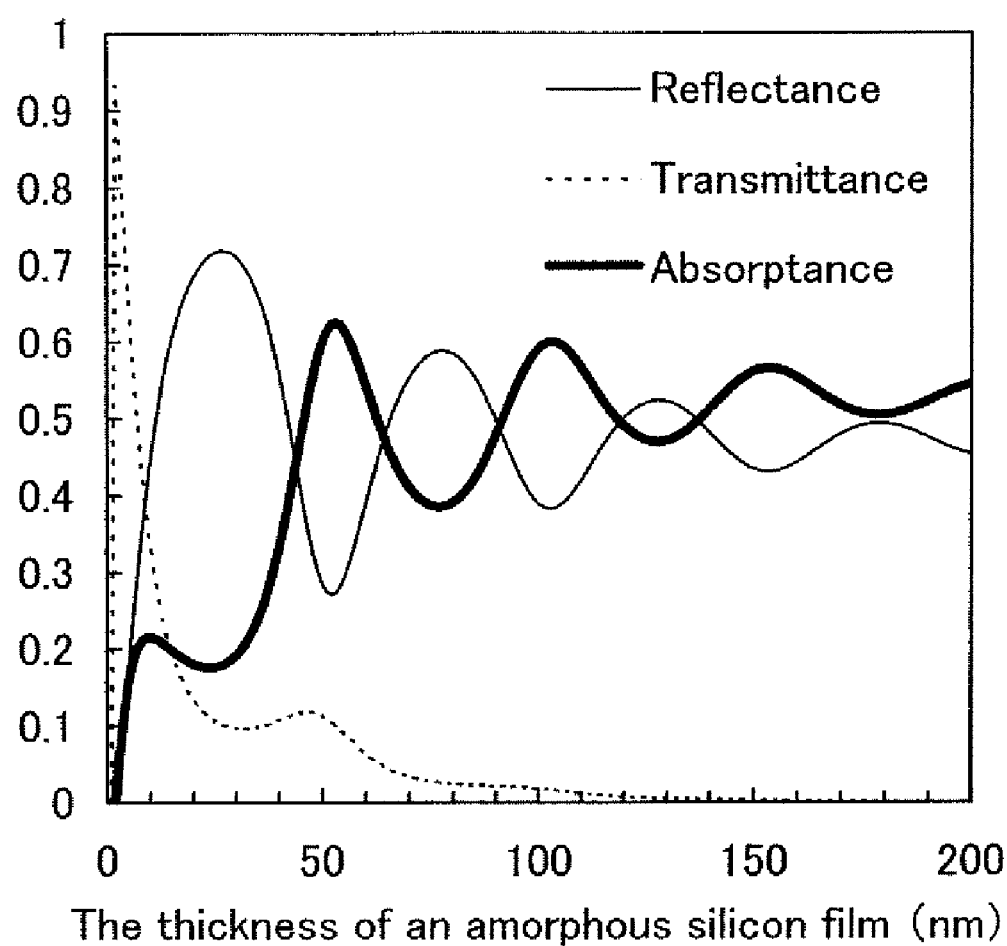
FIG. 24 is a graph of reflectance, transmittance, and absorptance of an amorphous silicon film with respect to light having a wavelength of 532 nm.

In the EL module shown in FIGS. 22A and 22B, a semiconductor element and a light emitting element are seated with the first substrate 1301, the second substrate 1306, and the sealant 1305. Over the first substrate 1301, a pixel portion 1302, a signal line driver 1303, and a scan driver 1304 are formed, thus forming an EL module substrate. A crystalline semiconductor film which has been crystallized by a method of the present invention is used for the thin film transistor; thus, a high performance EL module which can drive with low power consumption.

The substrate for the EL module is sealed with the sealant 1305 and the second substrate 1306, so that the EL module is formed. A space sealed with the substrate for the EL module, the sealant 1305, and the second substrate 1306 is filled with a filler 1307. As the filler 1307, an ultraviolet curable resin, a thermosetting resin can be used, in addition to an inert gas such as nitrogen or argon.

The pixel portion 1302, the driver circuit area 1303, and the driver circuit area 1304 each include a plurality of thin film transistors. FIG. 22B shows only a thin film transistor 1308 included in the driver circuit area 1303 and a thin film transistor 1310 included in the pixel portion 1302. The pixel portion 1302 includes a light-emitting element 1311, and the light-emitting element 1311 is electrically connected to the thin film transistor 1310.

A lead wiring 1314 is a wiring for supplying a signal or power from outside the module. The lead wiring 1314 is connected to a two-layer connection terminal 1316 through a lead wiring 1315*a* and a lead wiring 1315*b*. The connection terminal 1316 is electrically connected to a terminal of a flexible printed circuit (FPC) 1318 through an anisotropic conductive film 1319.

Embodiment 6

A semiconductor device of the present invention includes electronic devices provided with the liquid crystal module described in Embodiment 4 or the EL module of Embodiment 5 in a display portion. Hereinafter, a liquid crystal module and an EL module are collectively referred to as a "display module". As such an electronic appliance, there are a monitor for a computer, a television set (also simply referred to as a television or a television receiver), a camera such as a digital camera or a digital video camera, a mobile phone set (also simply referred to as a cellular phone set or a cellular phone), a portable information terminal such as a PDA (Personal Digital Assistant), a notebook computer, a car audio system, a navigation system, a digital music player, a portable DVD reproducing device, a portable game machine, an arcade game machine, and the like. The specific examples of electronic devices will be explained with reference to FIGS. 23A to 23C.

A mobile information terminal shown in FIG. 23A includes a main body 9201, a display portion 9202, and the like. By applying a module described in Embodiment 4 or 5 to the display portion 9202, a low power consumption mobile information terminal capable of high definition display can be provided.

A digital video camera shown in FIG. 23B includes a display portion 9701, a display portion 9702, and the like. By applying a module described in Embodiment 4 or 5 to the display portion 9701, a low power consumption digital video camera capable of high definition display can be provided.

A mobile terminal shown in FIG. 23C includes a main body 9101, a display portion 9102, and the like. By applying a module described in Embodiment 4 or 5 to the display portion 9102, a low power consumption mobile terminal capable of high definition display can be provided.

A mobile television device shown in FIG. 23D includes a main body 9301, a display portion 9302, and the like. By applying a module described in Embodiment 4 or 5 to the display portion 9302, a low power consumption mobile television device capable of high definition display can be provided. Such a television device can be widely applied to a small-sized device to be mounted to a mobile terminal such as a mobile phone, a middle-sized device that is portable, and a large-sized device (for example, 40 inches or more).

The mobile computer shown in FIG. 23E includes a main body 9401, a display portion 9402, and the like. By applying a module described in Embodiment 4 or 5 to the display portion 9402, a low power consumption mobile computer capable of high definition display can be provided.

The television device shown in FIG. 23F includes a main body 9501, a display portion 9502, and the like. By applying a module described in Embodiment 4 or 5 to the display portion 9502, a low power consumption television device capable of high definition display can be provided.

This application is based on Japanese Patent Application serial No. 2006-327584 filed with Japan Patent Office on Dec. 4, 2006, the entire contents of which are hereby incorporated by reference.

What is claimed is:

1. A method of manufacturing a semiconductor device, comprising the steps of:
   forming a semiconductor film over a substrate;
   forming an insulating film over the semiconductor film;
   forming a film over the insulating film, the film having a plurality of projections with a triangular cross-sectional shape on surface of the film;
   irradiating the semiconductor film with a laser beam applied from above the film to crystallize the semiconductor film; and
   processing the crystallized semiconductor film and the insulating film into an island-shaped semiconductor film and an island-shaped insulating film concurrently after the irradiating step,
   wherein a wavelength of the laser beam is in a range of from 400 nm to 565 nm,
   wherein a base of a triangular cross-section of at least one of the plurality of projections has a length that is in a range of from $1/3$ of the wavelength of the laser beam to the wavelength of the laser beam, and
   wherein a height of one of the plurality of projections is in a range of from $1/3$ of the wavelength of the laser beam to the wavelength of the laser beam.

2. A method of manufacturing a semiconductor device according to claim 1,
   wherein the laser beam is a beam emitted from a continuous wave laser or a quasi-continuous wave laser.

3. A method of manufacturing a semiconductor device according to claim 1,
   wherein each of the plurality of projections is triangular prism.

4. A method of manufacturing a semiconductor device according to claim 1,
   wherein the film is a light absorbing film.

5. A method of manufacturing a semiconductor device according to claim 4,
   wherein the light absorbing film is a metal film.

6. A method of manufacturing a semiconductor device according to claim 1,
   wherein the film is a light-transmitting film.

7. A method of manufacturing a semiconductor device according to claim 6,
   wherein the light-transmitting film comprises at least one of silicon oxide, silicon nitride, and silicon oxynitride.

8. A method of manufacturing a semiconductor device, comprising the steps of:
   forming a semiconductor film over a substrate;
   forming an insulating film over the semiconductor film;
   forming a film over the insulating film, the film having a plurality of conical projections on surface of the film;
   irradiating the semiconductor film with a laser beam applied from above the film to crystallize the semiconductor film; and
   processing the crystallized semiconductor film and the insulating film into an island-shaped semiconductor film and an island-shaped insulating film after the irradiating step,
   wherein a wavelength of the laser beam is in a range of from 400 nm to 565 nm,
   wherein a diameter of one of the plurality of conical projections is in a range of from $1/3$ of the wavelength of the laser beam to the wavelength of the laser beam, and
   wherein a height of one of the plurality of conical projections is in a range of from $1/3$ of the wavelength of the laser beam to the wavelength of the laser beam.

9. A method of manufacturing a semiconductor device according to claim 8,
   wherein the laser beam is a beam emitted from a continuous wave laser or a quasi-continuous wave laser.

10. A method of manufacturing a semiconductor device according to claim 8,
    wherein the film is a light absorbing film.

11. A method of manufacturing a semiconductor device according to claim 10,
    wherein the light absorbing film is a metal film.

12. A method of manufacturing a semiconductor device according to claim 8,
    wherein the film is a light-transmitting film.

13. A method of manufacturing a semiconductor device according to claim 12,
    wherein the light-transmitting film comprises at least one of silicon oxide, silicon nitride, and silicon oxynitride.

* * * * *